(12) United States Patent
Wu

(10) Patent No.: US 10,804,230 B2
(45) Date of Patent: Oct. 13, 2020

(54) SEMICONDUCTOR PACKAGE AND METHOD OF MANUFACTURING THE SAME

(71) Applicant: TAIWAN SEMICONDUCTOR MANUFACTURING COMPANY LTD., Hsinchu (TW)

(72) Inventor: Tung-Jiun Wu, Hsinchu County (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 10 days.

(21) Appl. No.: 16/162,892

(22) Filed: Oct. 17, 2018

(65) Prior Publication Data

US 2020/0126935 A1 Apr. 23, 2020

(51) Int. Cl.
*H01L 23/00* (2006.01)

(52) U.S. Cl.
CPC ............ *H01L 24/02* (2013.01); *H01L 23/562* (2013.01); *H01L 24/13* (2013.01); *H01L 2224/0235* (2013.01); *H01L 2224/02311* (2013.01); *H01L 2224/02331* (2013.01); *H01L 2224/02373* (2013.01); *H01L 2224/02379* (2013.01); *H01L 2224/02381* (2013.01); *H01L 2224/13024* (2013.01); *H01L 2924/19041* (2013.01); *H01L 2924/19103* (2013.01); *H01L 2924/3511* (2013.01); *H01L 2924/3512* (2013.01)

(58) Field of Classification Search
CPC ......... H01L 21/76802; H01L 21/76877; H01L 23/5222; H01L 23/5223
USPC .......................................................... 257/532
See application file for complete search history.

(56) References Cited

U.S. PATENT DOCUMENTS

| 8,802,504 | B1 | 8/2014 | Hou et al. |
| 8,803,292 | B2 | 8/2014 | Chen et al. |
| 8,803,316 | B2 | 8/2014 | Lin et al. |
| 8,993,380 | B2 | 3/2015 | Hou et al. |
| 9,281,254 | B2 | 3/2016 | Yu et al. |
| 9,299,649 | B2 | 3/2016 | Chiu et al. |
| 9,372,206 | B2 | 6/2016 | Wu et al. |
| 9,425,126 | B2 | 8/2016 | Kuo et al. |
| 9,443,783 | B2 | 9/2016 | Lin et al. |
| 9,496,189 | B2 | 11/2016 | Yu et al. |

(Continued)

*Primary Examiner* — David Vu
*Assistant Examiner* — Brandon C Fox
(74) *Attorney, Agent, or Firm* — WPAT, P.C., Intellectual Property Attorneys; Anthony King

(57) ABSTRACT

The present disclosure provides a semiconductor package, including a first conductive feature configured as an I/O terminal of the semiconductor package, a first passivation layer, a capacitor, and a second passivation layer. The first conductive feature includes a redistribution portion and a via portion. The maximum width of the redistribution portion along a first direction is more than 10 times the maximum width of the via portion along the first direction. The first passivation layer is surrounding the via portion of the first conductive feature. The capacitor is substantially within the first passivation layer and electrically coupled to the first conductive feature. The second passivation layer is formed on the first passivation layer and surrounding the redistribution portion of the first conductive feature. A method of manufacturing the semiconductor package is also provided.

20 Claims, 32 Drawing Sheets

(56) References Cited

U.S. PATENT DOCUMENTS

| | | | |
|---|---|---|---|
| 2007/0228573 A1* | 10/2007 | Matsunaga | H01L 23/5223 257/758 |
| 2010/0117197 A1* | 5/2010 | Cho | H01L 23/5223 257/532 |
| 2012/0181657 A1* | 7/2012 | Wu | H01L 23/5223 257/532 |
| 2012/0319239 A1* | 12/2012 | Chang | H01L 23/481 257/532 |
| 2015/0325520 A1* | 11/2015 | Yu | H01L 23/5384 257/774 |
| 2019/0103352 A1* | 4/2019 | Chou | H01L 23/5223 |

* cited by examiner

SEMICONDUCTOR PACKAGE AND METHOD OF MANUFACTURING THE SAME

BACKGROUND

Recently, semiconductor devices are becoming steadily smaller while having more functionality and greater amounts of integrated circuitry. To accommodate the miniaturized scale of the semiconductor device, 3D integrated circuits (3DICs), have emerged as an effective alternative to further reduce the physical size of a semiconductor device. In 3D packaging or 3DIC devices, a wafer level packaging (WLP) process is widely used due to its low cost and relatively simple manufacturing operations.

The WLP process has two main purposes: to protect delicate semiconductor chips and to connect interior integrated circuits to exterior pins. During the WLP process, a number of semiconductor components are assembled on the semiconductor device. As the manufacturing of the semiconductor device in a miniaturized scale becomes more complicated, increased complexity of manufacturing the semiconductor device may cause deficiencies such as development of cracks.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
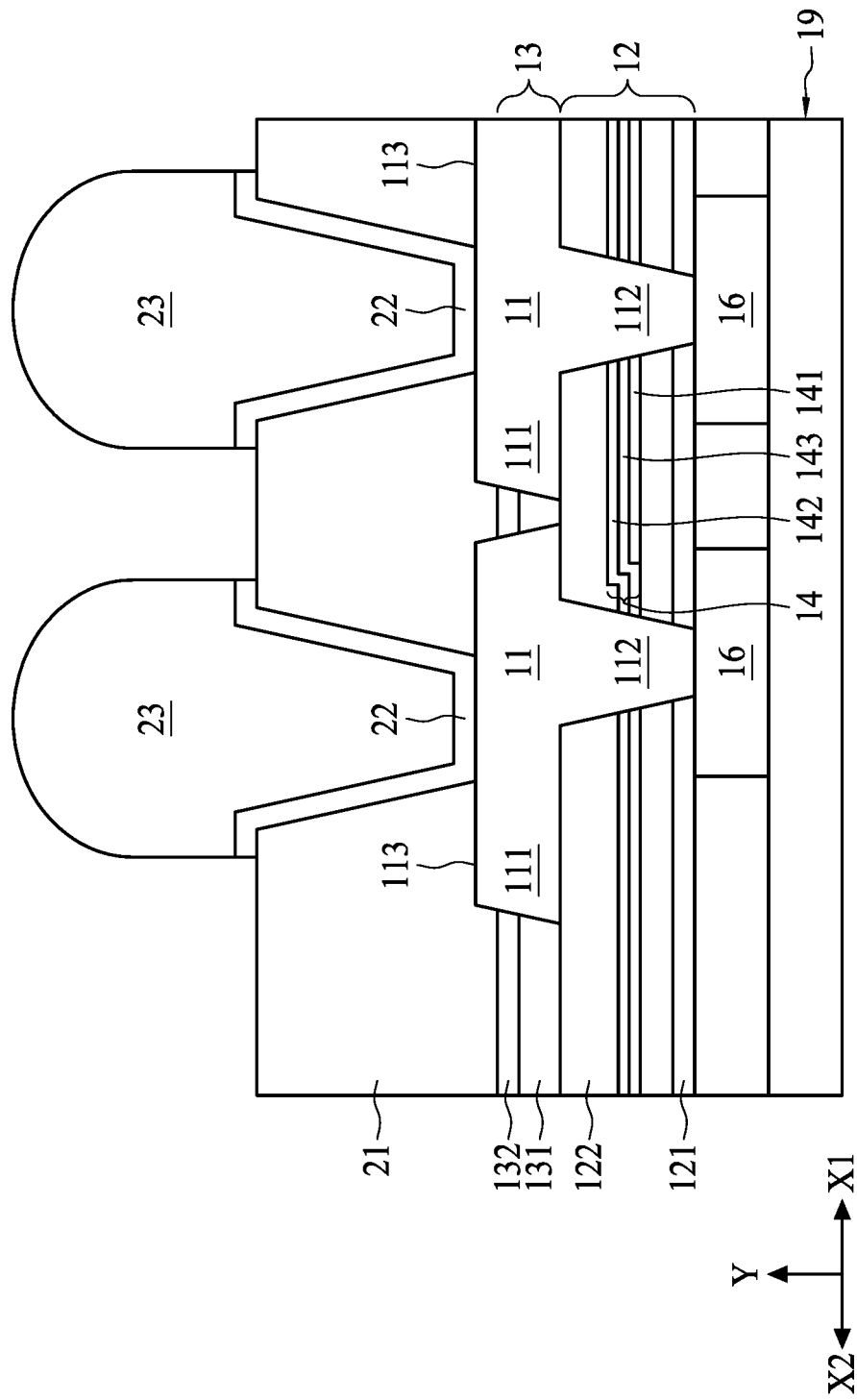
FIG. 1 is a cross-sectional view of a semiconductor package in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the term "about" generally means within 10%, 5%, 1%, or 0.5% of a given value or range. Alternatively, the term "about" means within an acceptable standard error of the mean when considered by one of ordinary skill in the art. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the term "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

Semiconductor packages and methods of manufacturing the same are provided. In particular, semiconductor packages with embedded conductive features and a plurality of passivation layers are described in greater detail below. In addition, methods of forming semiconductor packages that utilize embedded conductive features and a plurality of passivation layers are also provided below. Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

Electronic equipment using semiconductor devices is essential for many modern applications. A die is fabricated and singulated from a semiconductive wafer. After singulation, the die is packaged to become a semiconductor package and integrated with another die or package. In a semiconductor package, the die is encapsulated by a passivation layer, and I/O terminals of the die are routed out from the die through conductive features disposed within a passivation layer. Such configuration of the semiconductor package involves different kinds of materials (e.g., the die, the passivation layer, the conductive features, etc.) with different thermal properties (e.g., different coefficients of thermal expansion (CTE), etc.).

A mismatch of CTEs can cause cracking or warping to occur within the semiconductor package. Generally, a die and/or WLP may be subject to stress (e.g., thermal stress or mechanical stress) during the process of attaching the die and/or WLP to a printed circuit board (PCB), a temperature reliability test, and/or during drop/shock/bending events. In some embodiments, during a process to attach a die to a PCB (when the temperature goes from about 25° C. to about 230° C. then to about 25° C. again in some instances), different components expand and shrink at different rates because different components have different CTEs. In some embodiments, the die and/or WLP (which is made of silicon) has a CTE of about 2.7 ppm, while the PCB has a CTE that is greater than 10 ppm (mostly about 17 ppm). In some embodiments, the die and/or WLP is coupled to the PCB by copper bump interconnects. The stress on the die or WLP comes from the difference in CTEs (CTE mismatch) between the WLP and the PCB and the way in which the WLP and PCB are coupled to each other. Furthermore, after the WLP is mounted onto the PCB, the WLP will experience temperature swings as part of field conditions. Such temperature swings cause stress on the dies as well. Moreover, under normal device usage conditions, shock or bending events will generate stress in the WLP. Therefore, there is a need for a designed semiconductor package to stop or prevent the propagation of a crack.

Before addressing illustrated embodiments specifically, advantageous features and certain aspects of the exemplary embodiments are discussed generally. General aspects of embodiments described herein include a conductive feature and a plurality of passivation layers designed to alleviate passivation cracks, film delamination, bump-inducing damage, or other defects appearing in the semiconductor package.

FIG. 1 is a cross-sectional view illustrating a semiconductor package according to aspects of the present disclosure in some embodiments. Referring to FIG. 1, a semiconductor package includes a first conductive feature 11 configured as an input/output (I/O) terminal of the semiconductor package, and a first passivation layer 12 surrounding a via portion 112 of the first conductive feature 11. The semiconductor package further includes a capacitor 14 substantially within the first passivation layer 12 and electrically coupled to the first conductive feature 11, and a second passivation layer 13 formed on the first passivation layer 12 and surrounding the redistribution portion 111 of the first conductive feature 11. In some embodiments, the semiconductor package is an integrated fan out (InFO) package, which allows I/O terminals of a die to be fanned out and redistributed over a greater area of a surface of the die.

In some embodiments, the semiconductor package includes at least two first conductive features 11. The first conductive features 11 are respectively configured as an input/output (I/O) terminal of the semiconductor package. In some embodiments, each of the first conductive features 11 is electrically coupled to a corresponding conductive trace 16.

In some embodiments, the first conductive feature 11 is configured to reduce the stress and minimize, prevent, and/or stop the spreading of a crack that may start from the top of the semiconductor package where a PCB may be coupled to the semiconductor package. In some embodiments, the first conductive feature 11 can increase a resistance to a stress or force over or within the semiconductor package. In some embodiments, the first conductive feature 11 can reduce warping within the semiconductor package caused by CTE mismatch between the first passivation layer 12, the capacitor 14 and the second passivation layer 13. In some embodiments, the maximum width of the redistribution portion 111 along a first direction X1 or a second direction X2 is more than 10 times the maximum width of the via portion 112 along the first direction X1 or the second direction X2, but the disclosure is not limited thereto. In some embodiments, the redistribution portion 111 of the first conductive feature 11 has a thickness greater than 20000 Å along a third direction Y perpendicular to the first direction X1. As such, development of a crack can be minimized or prevented, and reliability of the semiconductor structure is improved.

In some embodiments, the first conductive feature 11 includes conductive material such as gold (Au), silver (Ag), copper (Cu), nickel (Ni), tungsten (W), aluminum (Al), tin (Sn), tantalum (Ta), tantalum nitride (TaN), aluminium copper (AlCu) and/or alloys thereof.

In some embodiments, the redistribution portion 111 of the first conductive feature 11 is disposed over a surface of the via portion 112. In some embodiments, a cross section of the redistribution portion 111 of the first conductive feature along the first direction X1 or the second direction X2 is in a circular, quadrilateral or polygonal shape.

In some embodiments, the via portion 112 of the first conductive feature 11 is surrounded by the first passivation layer 12. In some embodiments, the via portion 112 of the first conductive feature 11 extends within or through the first passivation layer 12. In some embodiments, the via portion 112 extends along the third direction Y. In some embodiments, a portion of the via portion 112 is exposed through the first passivation layer 12 and is configured to electrically connect to a corresponding conductive trace 16 or any conductive structure. In some embodiments, a height of the via portion 112 along the third direction Y is substantially same as a thickness of the first passivation layer 12 along the third direction Y.

In some embodiments, a cross section of the via portion 112 along the first direction X1 is in a circular, quadrilateral or polygonal shape. In some embodiments, a maximum width or diameter of the cross section of the via portion 112 is less than about 200 um. In some embodiments, the maximum width or diameter of the cross section of the via portion 112 is between about 100 um and about 180 um. In some embodiments, an area of the cross section of the via portion 112 is less than about 30,000 um$^2$. In some embodiments, the via portion 112 is a through integrated fan out via (TIV) extending through the first passivation layer 12.

FIG. 1 illustrates only two first conductive features 11 for clarity and simplicity, but such example is intended to be illustrative only, and is not intended to be limiting to the embodiments. An ordinarily skilled person in the art would readily understand that any suitable number of the first conductive feature 11 may alternatively be utilized, and all such combinations are fully intended to be included within the scope of the embodiments. Additionally, while the first conductive features 11 are illustrated as having similar features, this is intended to be illustrative and is not intended to limit the embodiments, as the first conductive features 11 may have similar structures or different structures in order to meet the desired functional capabilities.

Still referring to FIG. 1, in some embodiments, the first passivation layer 12 surrounds the via portions 112 of the first conductive features 11. In some embodiments, the first passivation layer 12 is formed on an inter-metal dielectric (IMD) 19. In some embodiments, the first passivation layer 12 is located between the conductive trace 16 and the second passivation layer 13. In some embodiments, the first passivation layer 12 has one side contacting the conductive trace 16 and the other side contacting the second passivation layer 13.

In some embodiments, the first passivation layer 12 has a thickness greater than 8000 Å along a third direction Y perpendicular to the first direction.

In some embodiments, the first passivation layer 12 includes dielectric materials such as polyimide (PI), benzocyclobutene (BCB), polybenzoxazole (PBO), silicon nitride (SiN), silicon carbide (SiC), silicon oxide (SiO), silicon oxynitride (SiON), low-k dielectrics such as carbon doped oxides, extremely low-k dielectrics such as porous carbon doped silicon dioxide, or combinations thereof. In some embodiments, the first passivation layer 12 includes plasma enhanced oxide (PEOX). PEOX is also called radio frequency low-temperature plasma enhanced silicon dioxide thin film, which is created by the reaction of silane and nitrous oxide at a temperature of 400° C.

In some embodiments, the first passivation layer 12 is composed of at least two layers, such as a nitride-containing layer 121 and a planarizing layer 122 disposed on the nitride-containing layer 121. In some embodiments, the nitride-containing layer 121 includes SiN, SiC, SiON, high-k dielectrics or other applicable materials. In some embodiments, the planarizing layer 122 includes PEOX. In some embodiments, the planarizing layer 122 includes PEOX-USG (Undoped Silicate Glass). In some embodiments, thickness of the nitride-containing layer 121 is between 700 Å and 1000 Å. In some embodiments, the thickness of the planarizing layer 122 is between about 5000 Å and 8000 Å. In some embodiments, the thickness of the planarizing layer 122 is about 7000 Å.

In some embodiments, the capacitor 14 includes a capacitor bottom metal electrode 141 extending along the first direction X1 and electrically connected to the via portion 112 of one of the first conductive features 11, and a capacitor top metal electrode 142 extending along a second direction X2 opposite to the first direction X1 and electrically connected to the via portion 112 of the other one of the first conductive features 11. In some embodiments, the capacitor bottom metal electrode 141 has a thickness of about 400 Å along the third direction Y. In some embodiments, the thickness of the capacitor top metal electrode 142 is about 400 Å along the third direction Y. In some embodiments, the capacitor bottom metal electrode 141 includes titanium nitride (TiN). In some embodiments, the capacitor top metal electrode 142 includes TiN.

In some embodiments, the capacitor 14 further includes a dielectric layer 143 arranged between the capacitor bottom metal electrode 141 and the capacitor top metal electrode 142. In some embodiments, the dielectric layer 143 extends along the first direction X1 and contacts one of the first conductive features 11. In some embodiments, the dielectric layer 143 extends along the first direction X1 and the second direction X2, contacting both first conductive features 11. In some embodiments, the dielectric layer 143 has a thickness of about 60 Å along the third direction Y. In some embodiments, the dielectric layer 143 includes $ZrO_2$—$Al_2O_3$—$ZrO_2$ (ZAZ).

In some embodiments, the capacitor 14 is disposed between the first conductive features 11 as viewed from a top perspective. In some embodiments, the capacitor 14 is not fully covered by the conductive bumps 23 in the third direction Y.

Figure 2:
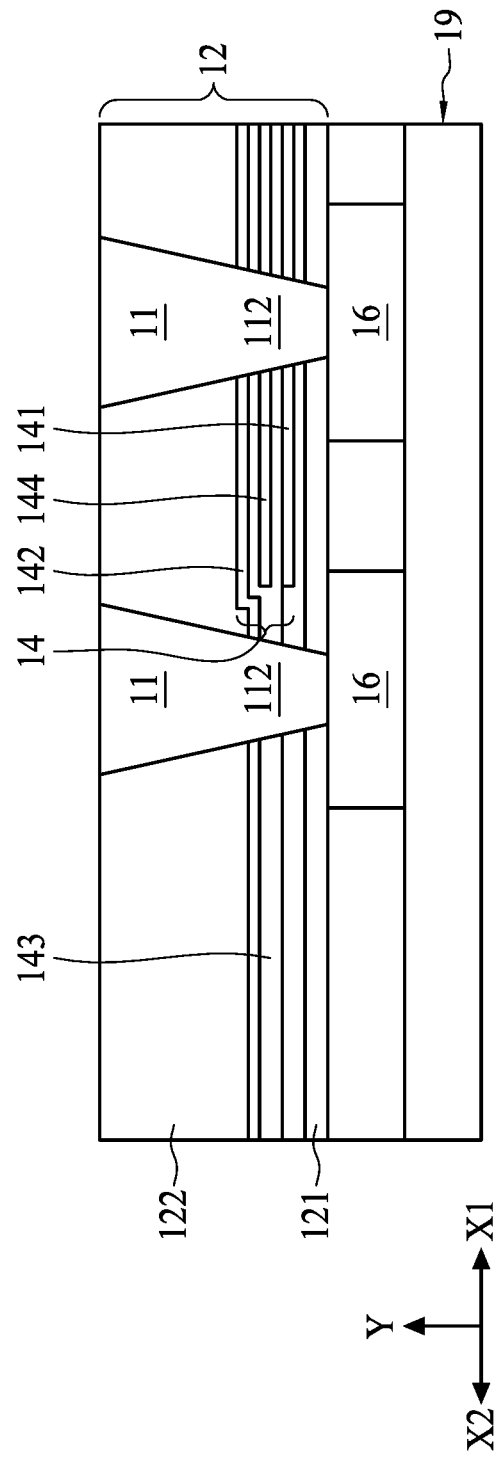
FIG. 2 is a partial cross-sectional view of a portion of a semiconductor package in accordance with some embodiments of the present disclosure.

FIG. 2 is a partial cross-sectional view of the semiconductor package. In some embodiments, as shown in FIG. 2, the capacitor 14 further includes a capacitor middle metal electrode 144 arranged between the capacitor bottom metal electrode 141 and the capacitor top metal electrode 142. In some embodiments, one dielectric layer 143 extends along the first direction X1 and is arranged between the capacitor bottom metal electrode 141 and the capacitor middle metal electrode 144, while another dielectric layer 143 extends along the first direction X1 and is arranged between the capacitor middle metal electrode 144 and the capacitor top metal electrode 142. In some embodiments, the capacitor middle metal electrode 144 includes TiN.

Referring back to FIG. 1, in some embodiments, the second passivation layer 13 is formed over or on the first passivation layer 12 and surrounds the redistribution portions 111 of the first conductive features 11. In some embodiments, the second passivation layer 13 covers a portion of a top surface 113 of the first conductive features 11. In some embodiments, the second passivation layer 13 covers the periphery portions of the top surfaces 113 of the first conductive features 11. In some embodiments, the second passivation layer 13 has a thickness greater than 12000 Å along the third direction Y. In some embodiments, thickness of the oxide-containing layers 131 is about 10000 Å. In some embodiments, thickness of the nitride-containing layers 132 is between 2000 and 4000 Å.

In some embodiments, the second passivation layer 13 is composed of at least two layers, such as an oxide-containing layer 131 extending along the first direction X1 and a nitride-containing layer 132 extending along the first direction X1 or the second direction X2. In some embodiments, the nitride-containing layer 132 of the second passivation layer 13 is disposed on the oxide-containing layer 131 of the second passivation layer 13. In some embodiments, the nitride-containing layer 132 includes SiN, SiC, SiON, high-k dielectrics or other applicable materials. In some embodiments, the oxide-containing layer 131 includes PEOX. In some embodiments, the oxide-containing layer 131 includes PEOX-USG. In some embodiments, a thickness of the oxide-containing layer 131 is between about 8000 Å and 15000 Å. In some embodiments, the thickness of the nitride-containing layer 132 is between about 2000 Å and 4000 Å.

In some embodiments, each of the via portions 112 of the first conductive features 11 is electrically connected to a corresponding conductive trace 16. In some embodiments, the conductive trace 16 is configured to electrically couple with a die or a conductive structure, but the disclosure is not limited thereto. In some embodiments, the conductive trace 16 includes conductive material such as gold, silver, copper, nickel, tungsten, aluminum, palladium and/or alloys thereof.

In some embodiments, each of the redistribution portions 111 of the first conductive feature is electrically connected to a corresponding conductive bump 23. In some embodiments, the conductive bump 23 is configured to electrically connect to circuitry or a conductive structure. In some embodiments, the conductive bump 23 is disposed over the redistribution portion 111 of the first conductive feature 11.

In some embodiments, the conductive bump 23 may be a contact bump, a wire bond, a metal pillar, or the like. In some embodiments, the conductive bump 23 includes conductive material such as tin (Sn), silver (Ag), lead-free tin (lead-free Sn), copper (Cu), or combinations thereof. In some embodiments, the conductive bump 23 is a solder bump, a ball grid array (BGA) ball, controlled collapse chip connection (C4) bump, microbump, a pillar or the like. In some embodiments, the conductive bump 23 is in a spherical, hemispherical or cylindrical shape. In some embodiments, the semiconductor package further includes an external device connected to the first conductive features 11 through the conductive bump 23.

In some embodiments, the semiconductor package further includes an insulation layer 21 disposed over the second passivation layer 17. In some embodiments, the insulation layer 21 is configured to reduce stress. In some embodiments, the insulation layer 21 includes PI, PbO, or a combination thereof. In some embodiments, the insulation layer 21 includes PI.

In some embodiments, the insulation layer 21 is configured to receive a bump pad 22 such as an under bump metallization (UBM) pad, and the bump pad 22 is configured to receive the conductive bump 23. In some embodiments, the bump pad 22 is disposed on the redistribution portion 111 of the first conductive features 11. In some embodiments, the first conductive feature 11 and the conductive trace 16 are electrically connected to the corresponding conductive bump 23 through the corresponding bump pad 22.

Figure 3:
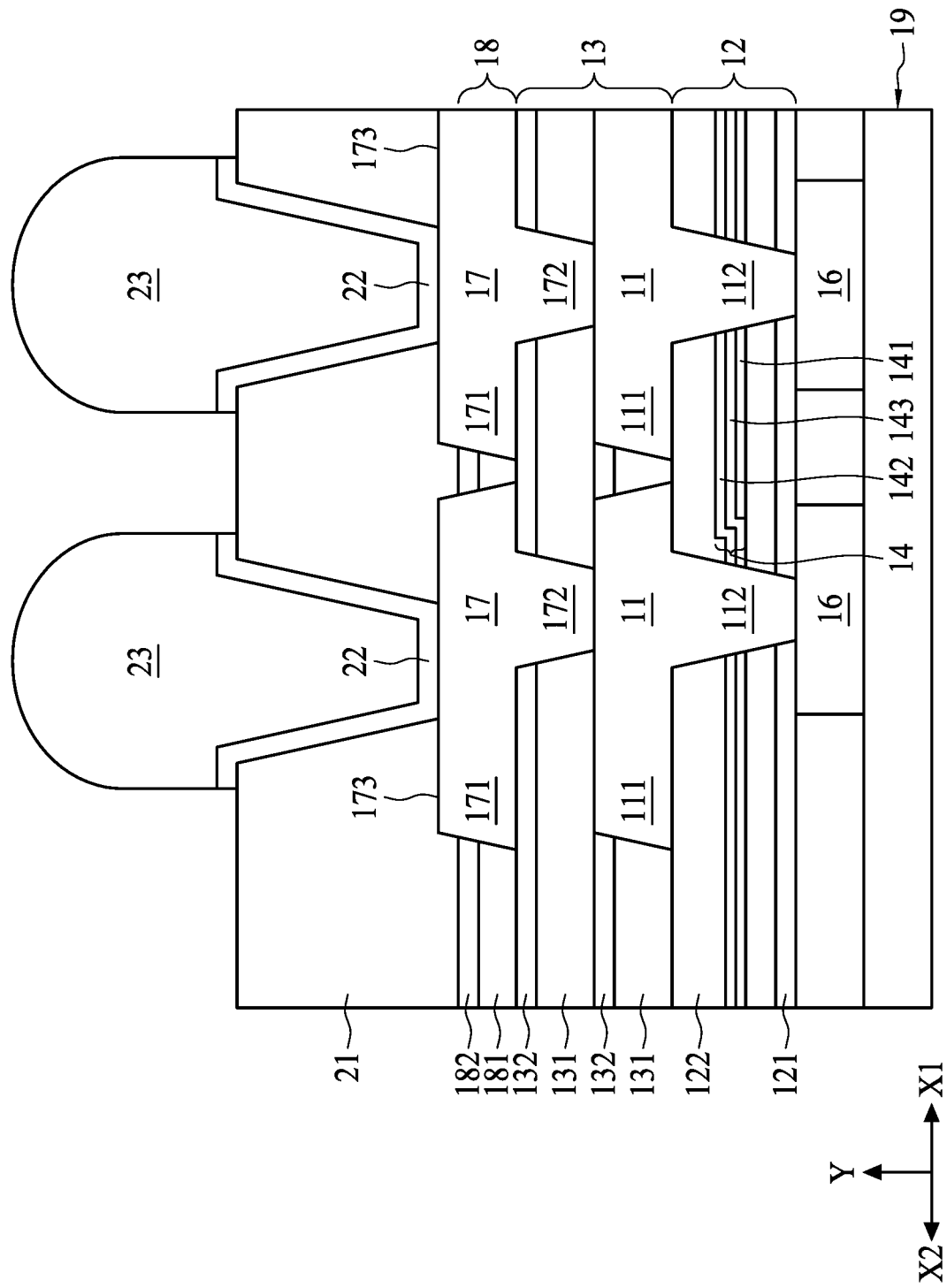
FIG. 3 is a cross-sectional view of a semiconductor package in accordance with some embodiments of the present disclosure.

FIG. 3 is a cross-sectional view illustrating a semiconductor package according to aspects of the present disclosure in some embodiments. Referring to FIG. 3, a semiconductor package includes at least two first conductive features 11 respectively configured as an input/output (I/O) terminal of the semiconductor package, and a first passivation layer 12 surrounding the via portions of the first conductive features 11. The semiconductor package further includes at least two second conductive features 17 respectively configured as an input/output (I/O) terminal of the semiconductor package, and a second passivation layer 13 formed on the first passivation layer 12 and surrounding the redistribution portions 111 of the first conductive features 11 and the via portions 172 of the second conductive features. The semiconductor package further includes a third passivation layer 18 formed on the second passivation layer 13 and surrounding the redistribution portions 171 of the second conductive features 17.

In some embodiments, each of the second conductive features 17 includes a redistribution portion 171 and a via portion 172, and the via portion 172 of each of the second conductive features 17 is electrically connected to the redistribution portion 111 of the corresponding first conductive feature 11.

In some embodiments, the second conductive feature 17 is configured to reduce stress and minimize, prevent, or stop the spreading of a crack that may start from the top of the semiconductor package where a PCB may be coupled to the semiconductor package. In some embodiments, the second conductive feature 17 can increase a resistance to stress or force over or within the semiconductor package. In some embodiments, the second conductive feature 17 can resist warpage within the semiconductor package caused by CTE mismatch between the first passivation layer 12 and the second passivation layer 13. In some embodiments, the maximum width of the redistribution portion 171 of the second conductive feature 17 along a first direction X1 or the second direction X2 is more than 10 times the maximum width of the via portion 172 of the second conductive feature 17 along the first direction X1 or the second direction X2, but the disclosure is not limited thereto. In some embodiments, the redistribution portion 171 of the second conductive feature 17 has a thickness greater than 20000 Å along a third direction Y. In some embodiments, thickness of the redistribution portion 171 of the second conductive feature 17 is 28000 Å along a third direction Y. As such, development of a crack can be minimized or prevented, and reliability of the semiconductor structure is improved. In some embodiments, design of the second conductive feature 17 may be similar to the design of the first conductive feature 11.

Material of the second conductive feature 17 may be similar to or different from the material of the first conductive feature 11, and the details of the material of the second conductive feature 17 are omitted herein for brevity.

In some embodiments, the redistribution portion 171 of the second conductive feature 17 is disposed over a surface of the corresponding via portion 172 of the second conductive feature 17. In some embodiments, the redistribution portion 171 of the second conductive feature 17 is surrounded by the third passivation layer 18.

In some embodiments, the via portion 172 of the second conductive feature 17 is surrounded by the second passivation layer 13. In some embodiments, the via portion 172 extends along the third direction Y. In some embodiments, the via portion 172 of the second conductive feature 17 is electrically connected to the corresponding redistribution portion 111 of the first conductive feature 11. In some embodiments, a sum of the height of the via portion 172 of the second conductive feature 17 and the height of the corresponding redistribution portion 111 of the first conductive feature 11 along the third direction Y is substantially same as a total thickness of the second passivation layer 13 along the third direction Y.

While the second conductive features 17 are described as having similar features, such description is intended to be illustrative and is not intended to limit the embodiments, as the second conductive features 17 may have similar structures or different structures in order to meet the desired functional requirements.

In some embodiments, the second passivation layer 13 is formed on the first passivation layer 12 and surrounds the redistribution portion 111 of the first conductive feature 11 and the via portion 172 of the second conductive feature 17. In some embodiments, the second passivation layer 13 has a thickness greater than 12000 Å along the third direction Y. In some embodiments, thickness of the oxide-containing layers 131 is about 10000 Å. In some embodiments, thickness of the nitride-containing layers 132 is between 2000 and 4000 Å.

In some embodiments, the second passivation layer 13 is composed of at least two layers, such as an oxide-containing layer 131 extending along the first direction X1 or the second direction X2 and a nitride-containing layer 132 extending along the first direction X1 or the second direction X2. In some embodiments, the nitride-containing layer 132 of the second passivation layer 13 is disposed on the oxide-containing layer 131 of the second passivation layer 13. In some embodiments, the nitride-containing layer 132 includes SiN, SiC, SiON, high-k dielectrics or other applicable materials. In some embodiments, the oxide-containing layer 131 includes PEOX. In some embodiments, the oxide-containing layer 131 includes PEOX-USG. In some embodiments, a thickness of the oxide-containing layer 131 is between about 8000 Å and 15000 Å. In some embodiments, the thickness of the nitride-containing layer 132 is between about 2000 Å and 4000 Å. In some embodiments, the ratio of the thickness of the oxide-containing layer 131 to the thickness of the nitride-containing layer 132 is 15:7.

In some embodiments, the second passivation layer 13 includes two oxide-containing layers 131 and one nitride-containing layer 132. In some embodiments, the oxide-containing layers 131 are arranged above and below the nitride-containing layer 132 in the Y direction, and the thickness ratio of the three layers is 1:3:1.

In some embodiments, the second passivation layer 13 includes two oxide-containing layers 131 and two nitride-containing layers 132. In some embodiments, the oxide-containing layers 131 and the nitride-containing layers 132 are alternatively stacking. In some embodiments, two oxide-containing layers 131 and two nitride-containing layers 132 are alternatively stacking, and the thickness ratio of the four layers along the third direction Y is 1:3:1:3. In some embodiments, thickness of the oxide-containing layers 131 is about 10000 Å. In some embodiments, thickness of the nitride-containing layers 132 is between 2000 and 4000 Å.

In some embodiments, the third passivation layer 18 is formed on the second passivation layer 13 and surrounds the redistribution portions 171 of the second conductive features 17. In some embodiments, the third passivation layer 18 covers a portion of the top surfaces 173 of the second conductive features 17. In some embodiments, the third passivation layer 18 covers the periphery portions of the top surfaces 173 of the second conductive features 17. The central portions of the top surfaces 173 of the second conductive features 17 are free from coverage of the third passivation layer 18. In some embodiments, the third passivation layer 18 has a thickness greater than 18000 Å along the third direction Y.

In some embodiments, the third passivation layer 18 is composed of at least two layers, such as an oxide-containing layer 181 extending along the first direction X1 or the second direction X2 and a nitride-containing layer 182 extending along the first direction X1 or the second direction X2. In some embodiments, the nitride-containing layer 182 of the third passivation layer 18 is disposed on the oxide-containing layer 181 of the third passivation layer 18. In some embodiments, the nitride-containing layer 182 includes SiN, SiC, SiON, high-k dielectrics or other applicable materials. In some embodiments, the oxide-containing layer 181 includes PEOX. In some embodiments, the oxide-containing layer 181 includes PEOX-USG. In some embodiments, a thickness of the oxide-containing layer 181 is between about 12000 Å and 18000 Å. In some embodiments, a thickness of the oxide-containing layer 181 is 15000 Å. In some embodiments, the thickness of the nitride-containing layer 182 is between about 6000 Å and 8000 Å. In some embodiments, the thickness of the nitride-containing layer 182 is 7000 Å.

In some embodiments, each of the redistribution portions 171 of the second conductive features 17 is electrically connected to a corresponding conductive bump 23. In some embodiments, the semiconductor package further includes an insulation layer 21 disposed over the third passivation layer 18. In some embodiments, the bump pad 22 is disposed on the redistribution portion 171 of the second conductive feature 17. In some embodiments, the first conductive feature 11, the corresponding second conductive feature 17, and the corresponding conductive trace 16 are electrically connected to the corresponding conductive bump 23 through the corresponding bump pad 22.

Figure 4:
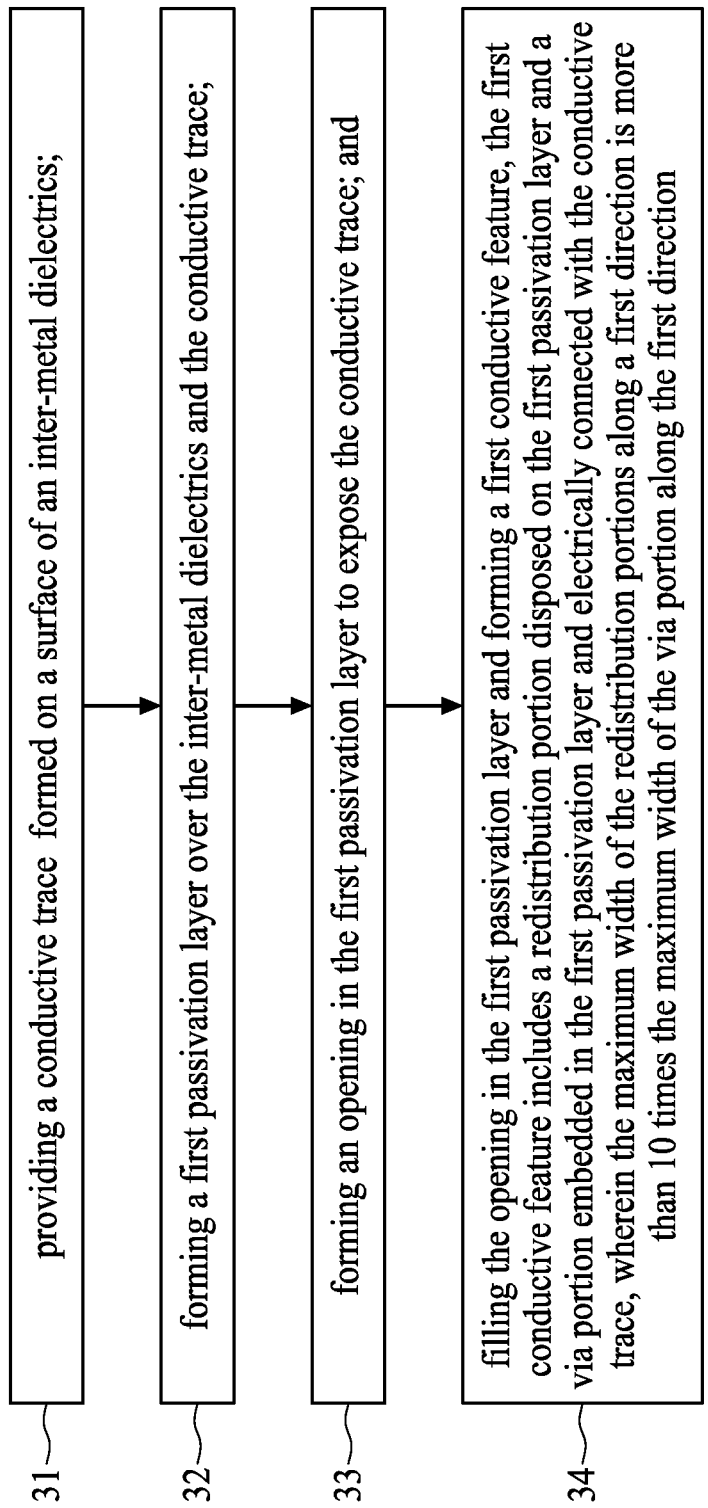
FIG. 4 shows a flowchart representing a method of manufacturing a semiconductor package according to aspects of the present disclosure in one or more embodiments.

In the present disclosure, a method of manufacturing a semiconductor package is disclosed. In some embodiments, a semiconductor structure is manufactured by the method. The method includes a number of operations and the description and illustration are not deemed as a limitation as the sequence of the operations. FIG. 4 is an embodiment of the method of manufacturing the semiconductor package. The method includes operations 31, 32, 33 and 34.

FIGS. 5 to 16 are cross-sectional views illustrating exemplary operations for manufacturing a semiconductor package of the present disclosure. In some embodiments, the operations of FIGS. 5 to 16 may be used to provide or manufacture the semiconductor package illustrated in FIG. 1.

Figure 5:
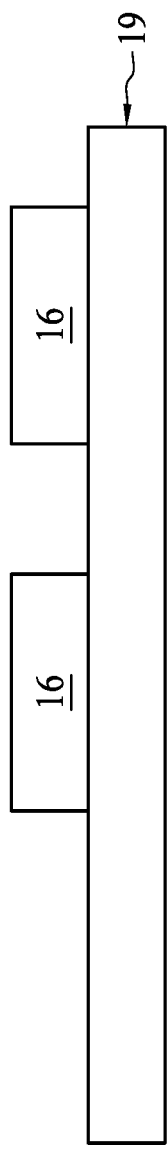
FIGS. 5-16 are cross-sectional views of a semiconductor package manufactured at various stages in accordance with some embodiments of the present disclosure.

In operation 31, conductive traces 16 formed on an IMD 19 are provided as shown in FIG. 5. The conductive traces 16 may be patterned using photolithography techniques.

Figure 6:
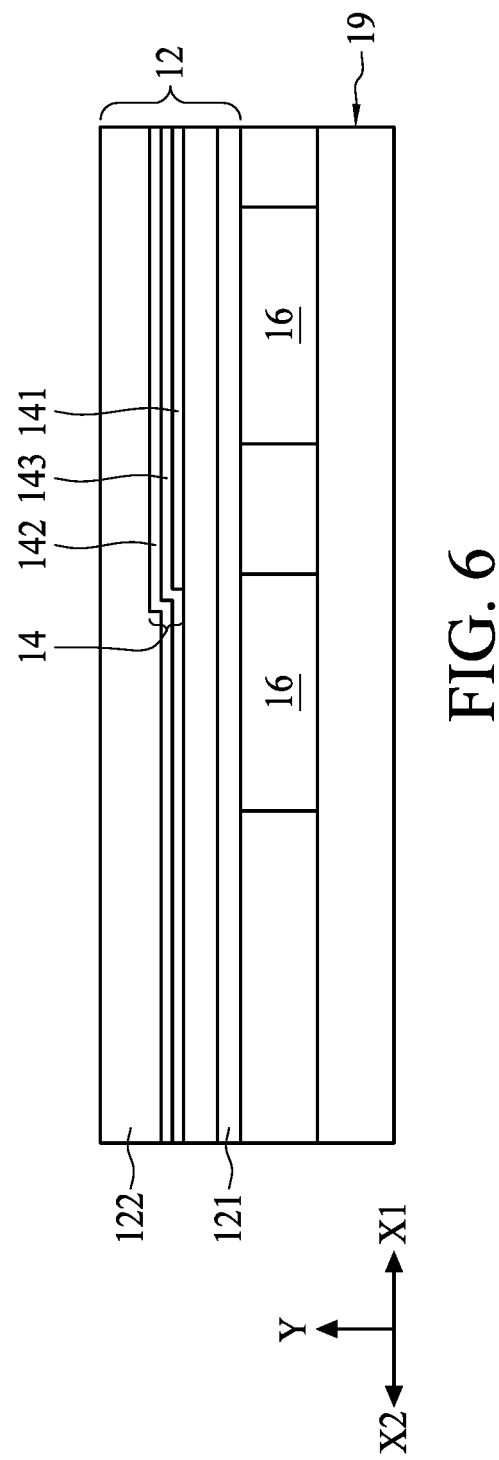

In operation 32, the first passivation layer 12 is formed over the conductive traces 16 and the IMDs 115, and a capacitor 14 is formed within the first passivation layer 12 as shown in FIG. 6. In some embodiments, the nitride-containing layer 121 is formed over the conductive traces 16, and the planarizing layer 122 is disposed on the nitride-containing layer 121.

Figure 7:
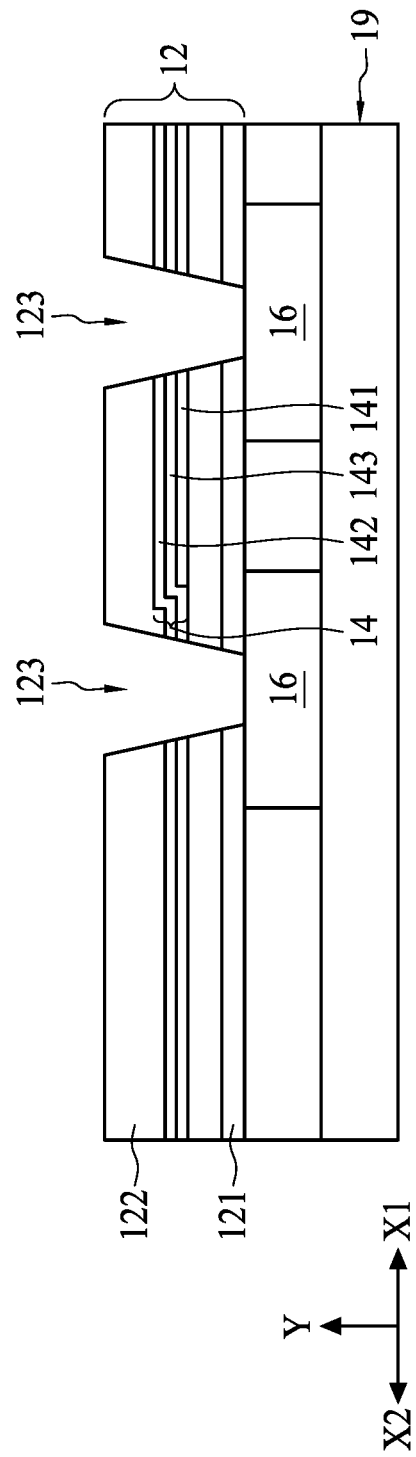

In operation 33, the openings 123 are formed in the first passivation layer 12 as shown in the FIG. 7. The openings 123 penetrate portions of the capacitor 14. The openings 123 may be formed by removing portions of the first passivation layer 12 to expose at least a portion of each of the underlying conductive traces 16. The openings 123 allow for contact between the conductive traces 16 and a subsequently-formed first conductor 110.

In some embodiments, a photoresist material (not shown) is formed over the first passivation layer 12. The photoresist material is subsequently irradiated (exposed) and developed to remove a portion of the photoresist material. Subsequently, the exposed portions of the first passivation layer 12 are removed using, for example, a suitable etching process to form the openings 123.

Figure 8:
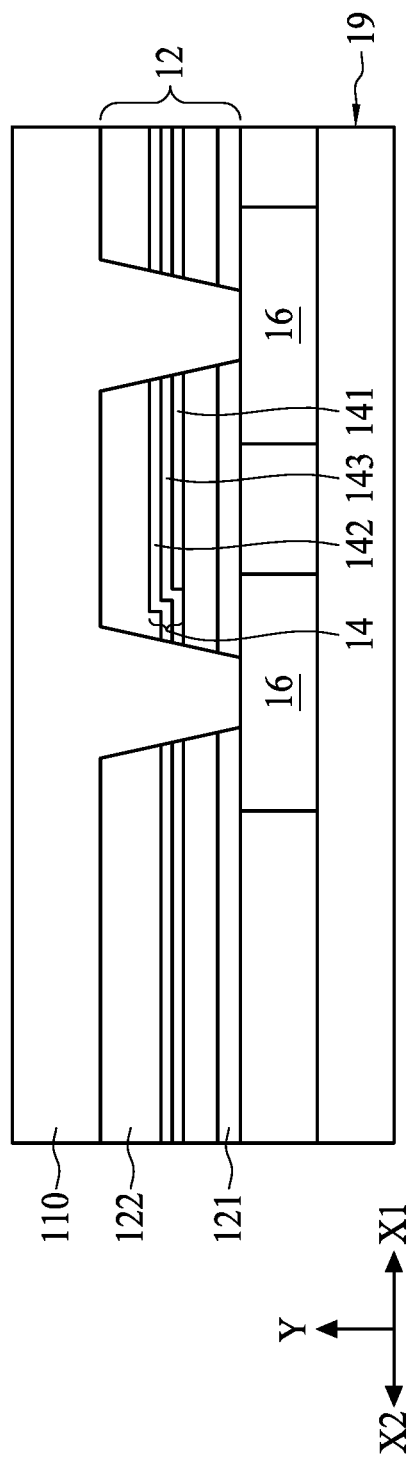

In operation 34, openings 123 are filled with conductive material and a first conductor 110 is formed on the first passivation layer 12 as shown in FIG. 8. The first conductor 110 may be formed using an electro-chemical plating process, an electroless plating process, PVD, ALD, the like, or a combination thereof. The first passivation layer 12, the capacitor 14 and the conductive traces 16 contact the first conductor 110.

Figure 9:
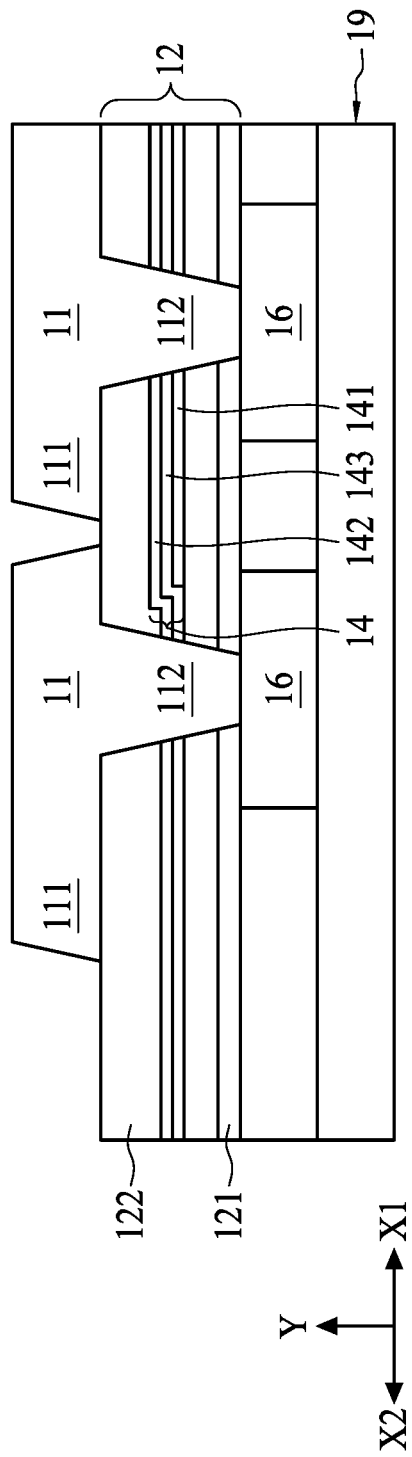

Further in operation 34, the redistribution portions 111 of the first conductive features 11 are formed as shown in FIG. 9. The redistribution portions 111 may be formed by first depositing a photoresist (not shown) on the first conductor 110. The photoresist may then be patterned to cover portions of the first conductor 110 where the first conductive features 11 are desired to be located. Once the photoresist has been formed and patterned, portions of the first conductor 110 not covered by the photoresist can be removed by a suitable etching process. Additionally, after the removal of the photoresist, excess conductive materials of the first conductor 110 can be removed through a CMP or the like.

Figure 10:
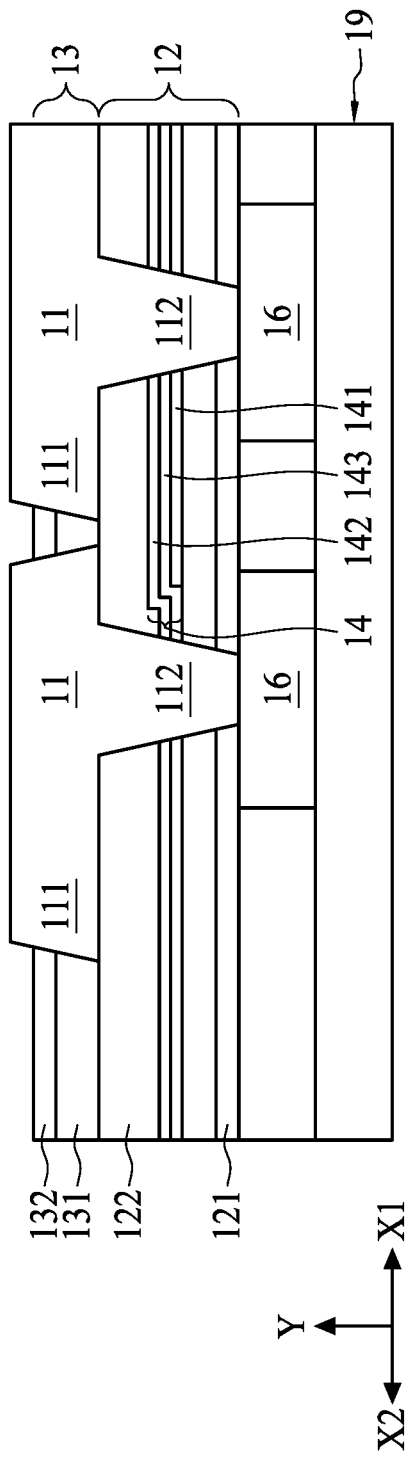

The method further includes the following operations. Referring to FIG. 10, the second passivation layer 13 is formed over the first conductive features 11 and the redistribution portions 111 of the first conductive features 11. In some embodiments, an oxide-containing layer 131 extending along the first direction X1 or the second direction X2 is formed over the first conductive features 11, and a nitride-containing layer 132 extending along the first direction X1 or the second direction X2 is disposed on the oxide-containing layer 131.

Figure 11:
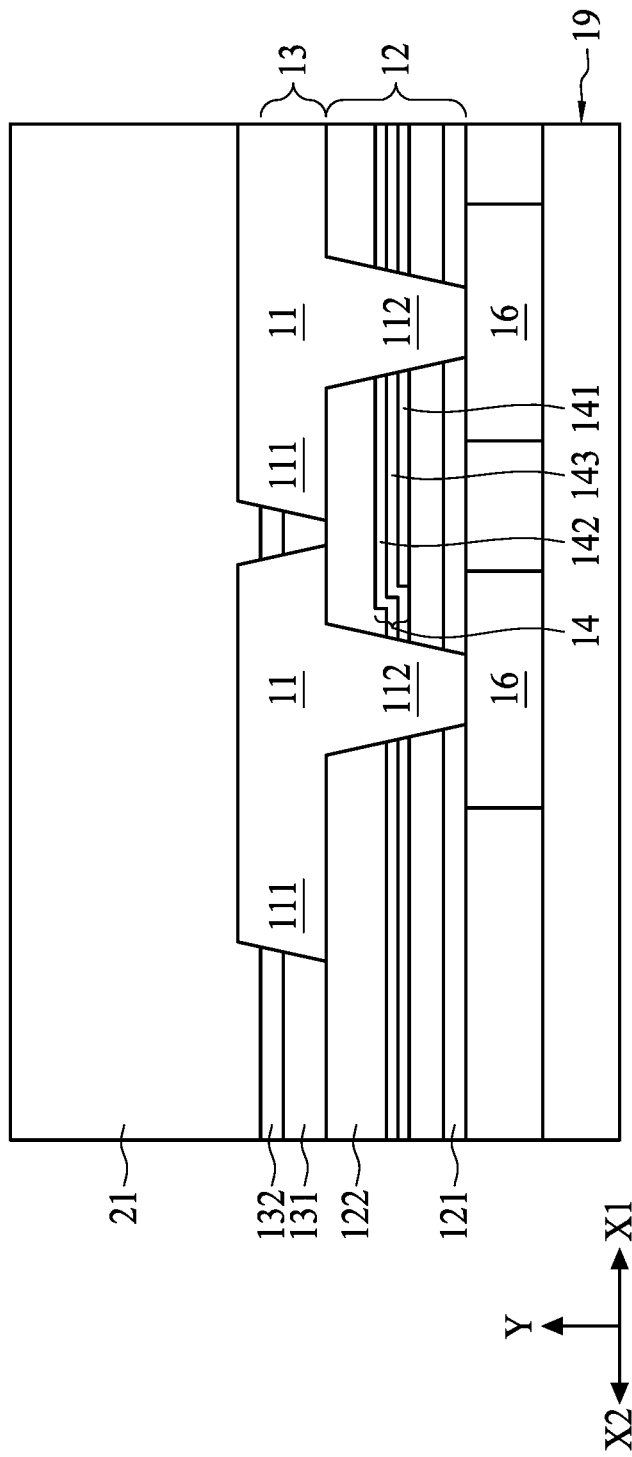

Referring to FIG. 11, an insulation layer 21 is formed on the second passivation layer 13 and the second conductive feature 17. The insulation layer 21 may be formed using an electro-chemical plating process, an electroless plating process, PVD, ALD, the like, or a combination thereof.

Figure 12:
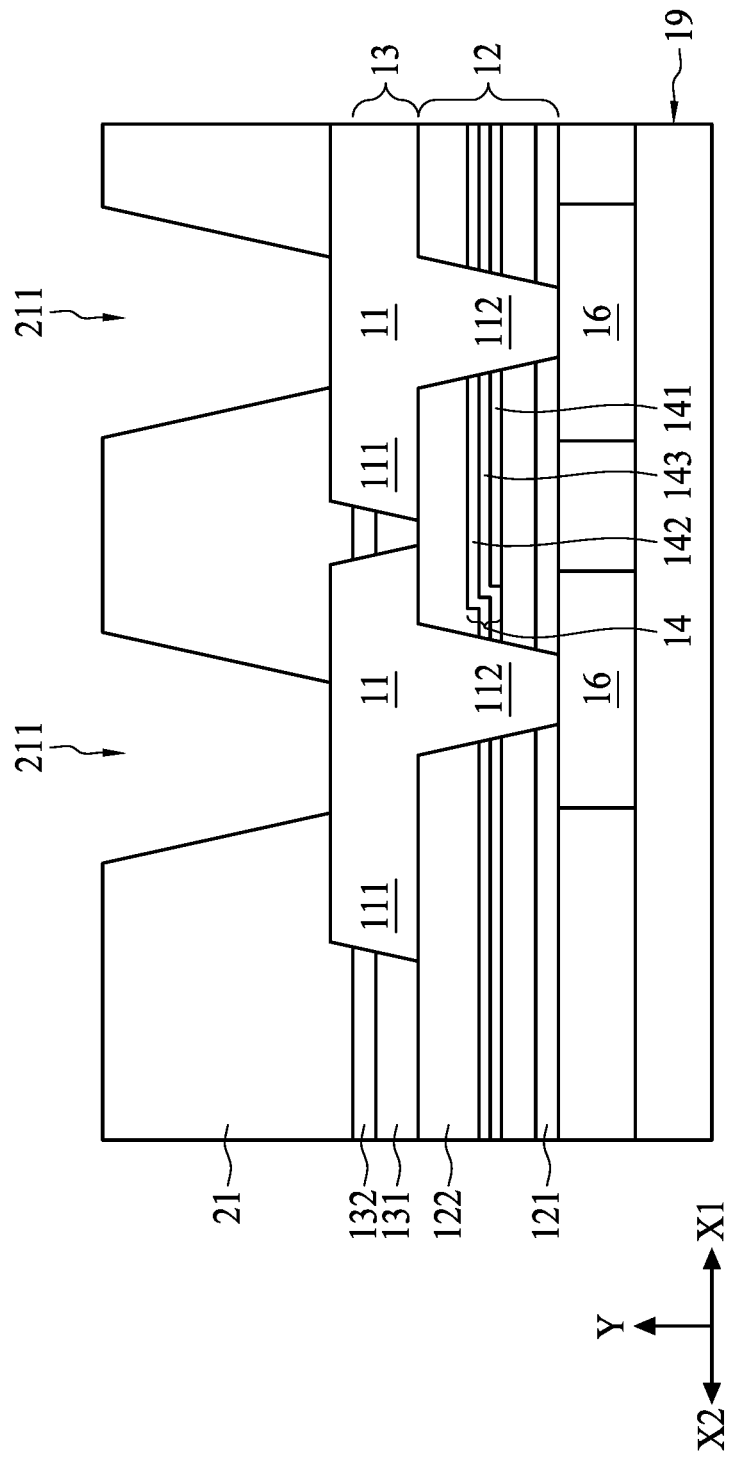

FIG. 12 illustrates the formation of the openings 211 in the insulation layer 21 to expose the central portions of the first conductive features 11. The central portions of the first conductive features 11 may be exposed using a suitable photolithographic mask and etching process, although any suitable process may be used.

Figure 13:
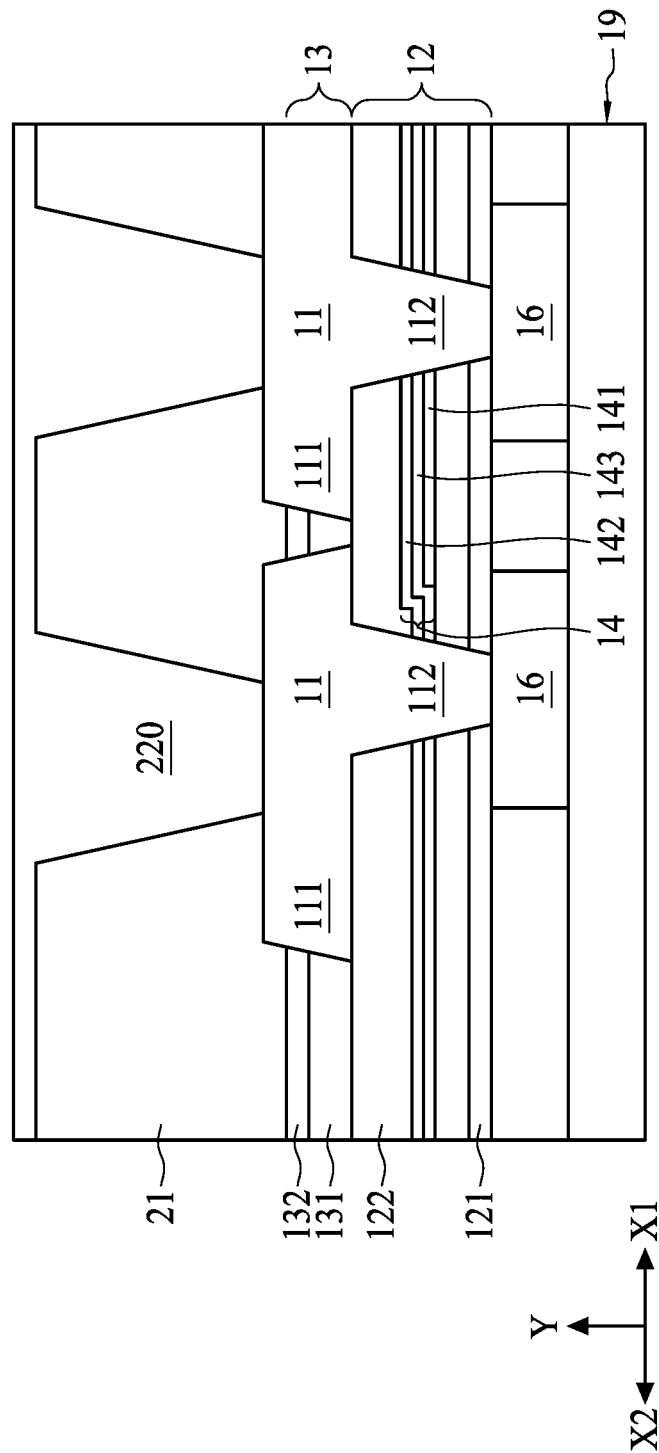

FIG. 13 illustrates the openings 211 filled with conductive material and a UBM layer 220 formed over the insulation layer 21. The UBM layer 220 may be deposited by PVD, sputtering, or other suitable operations.

Figure 14:
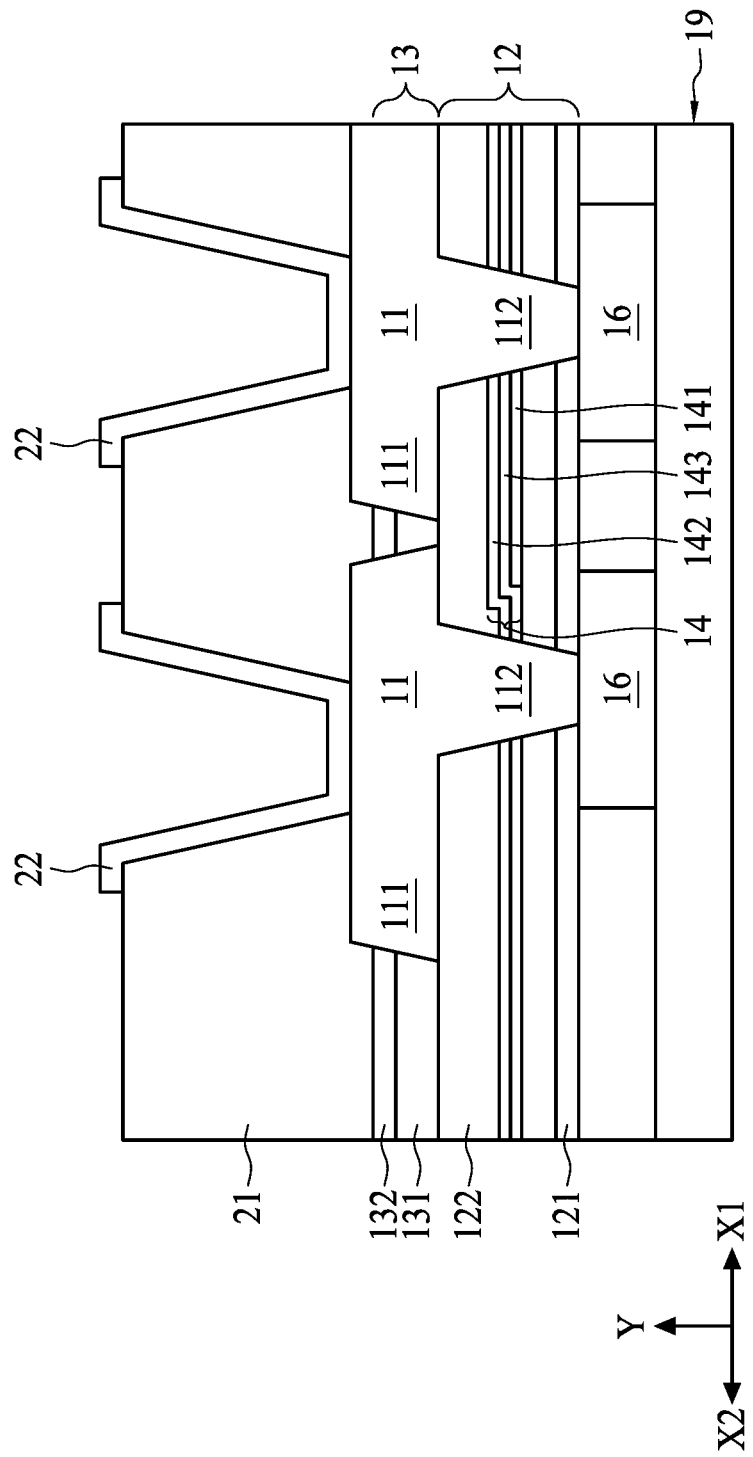

FIG. 14 illustrates bump pads 22 formed to further receive the conductive bumps 23. The UBM layer 220 may be patterned by depositing a mask layer and removing portions not covered by the mask layer through a suitable etching process.

Figure 15:
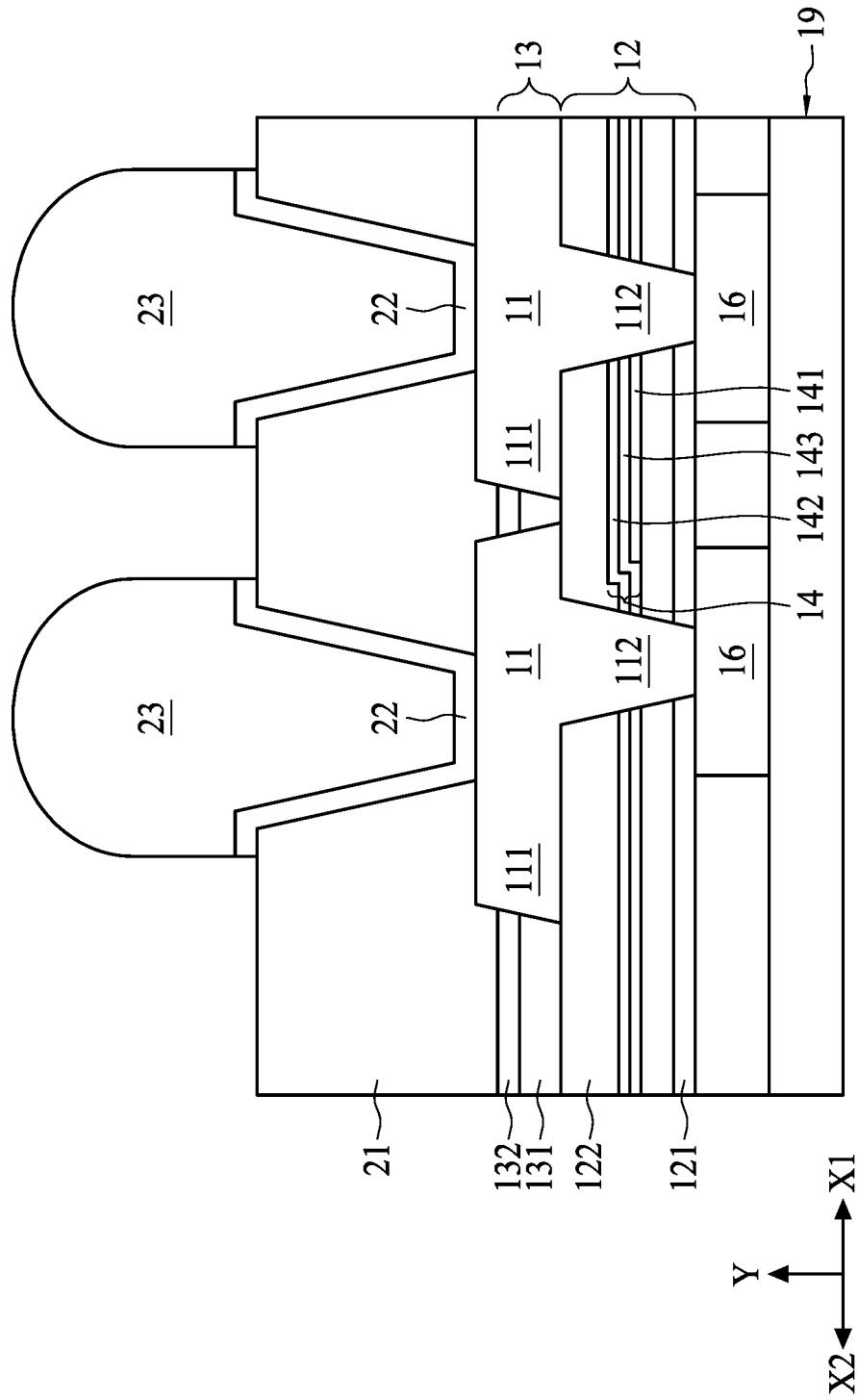

FIG. 15 illustrates the conductive bumps 23 placed over the corresponding bump pads 22. Heating-cooling cycles are performed for placing the conductive bumps 23.

Figure 16:
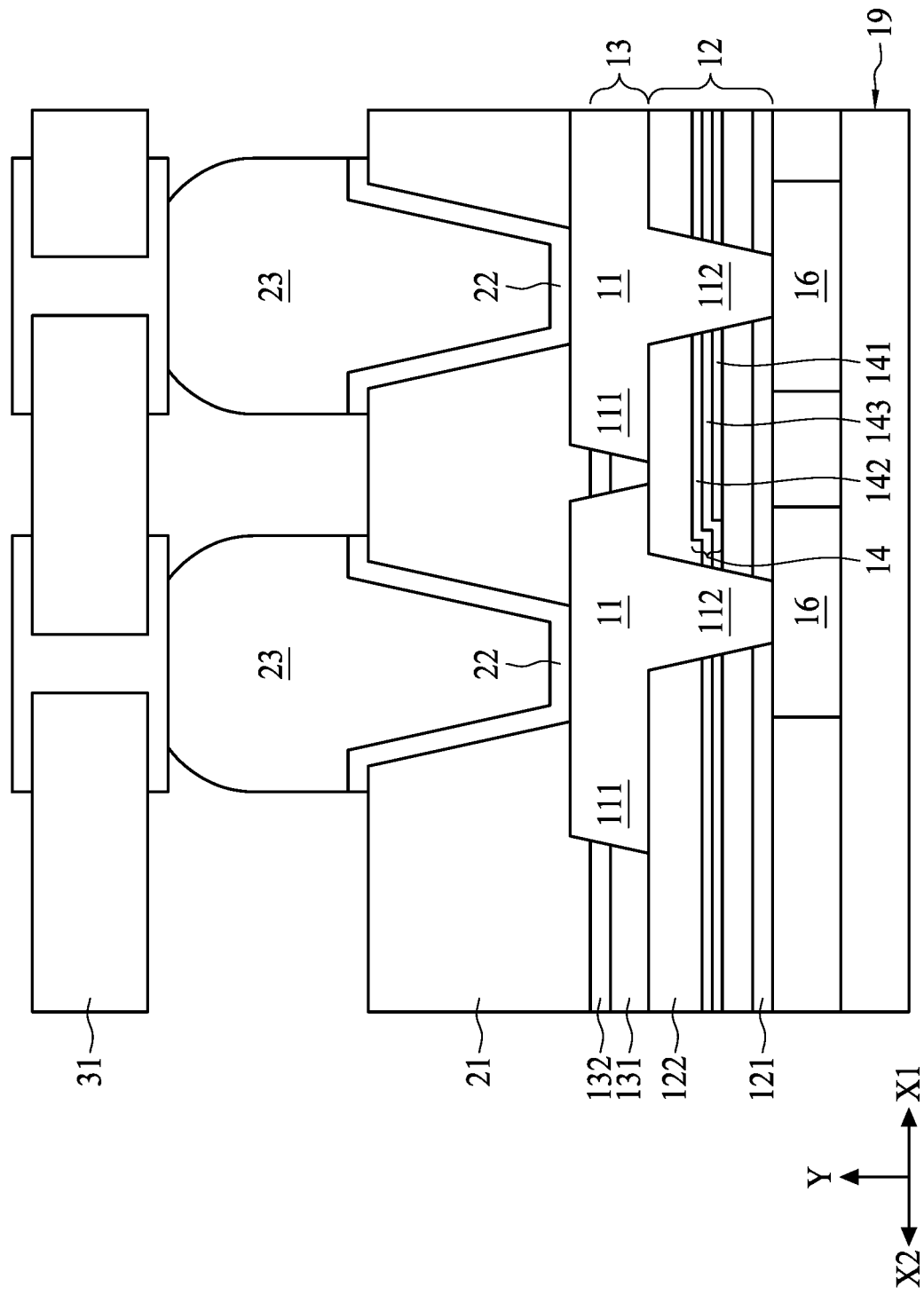
Figure 17:
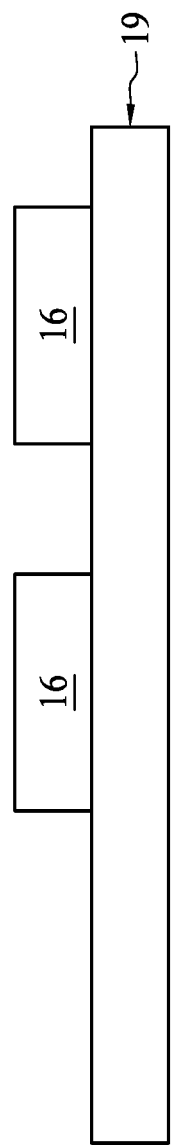
FIGS. 17-32 are cross-sectional views of a semiconductor package manufactured at various stages in accordance with some embodiments of the present disclosure.
Figure 18:
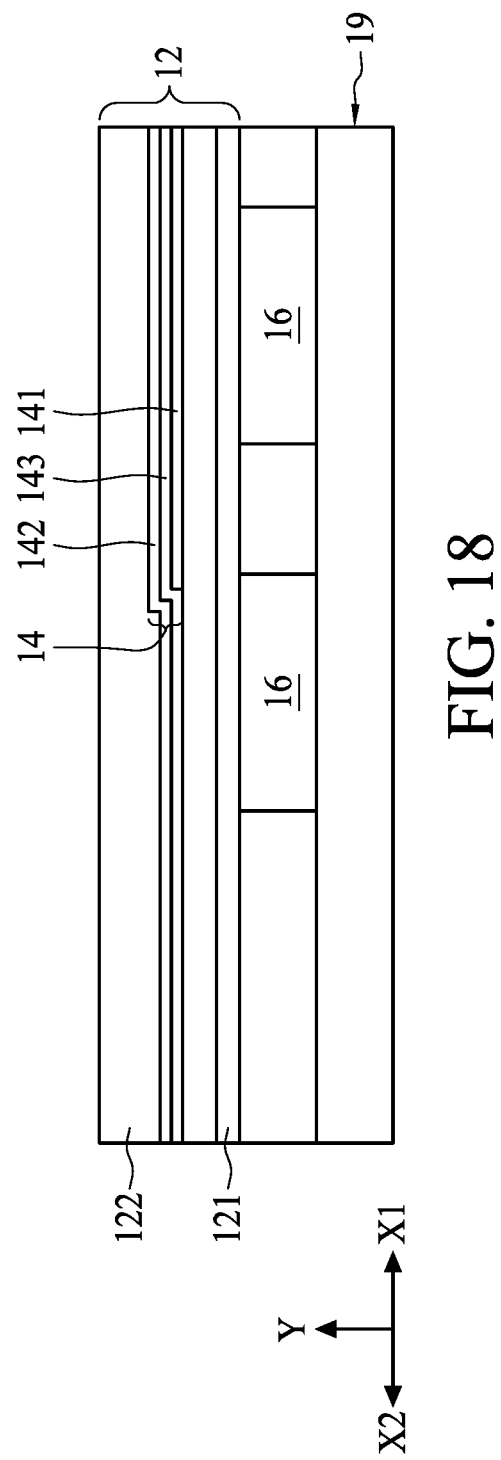
Figure 19:
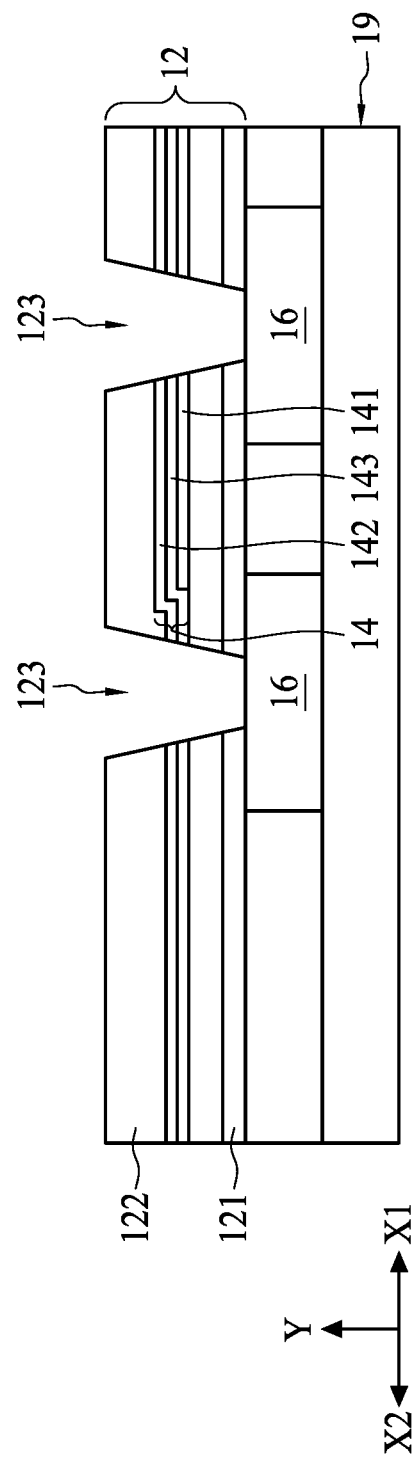
Figure 20:
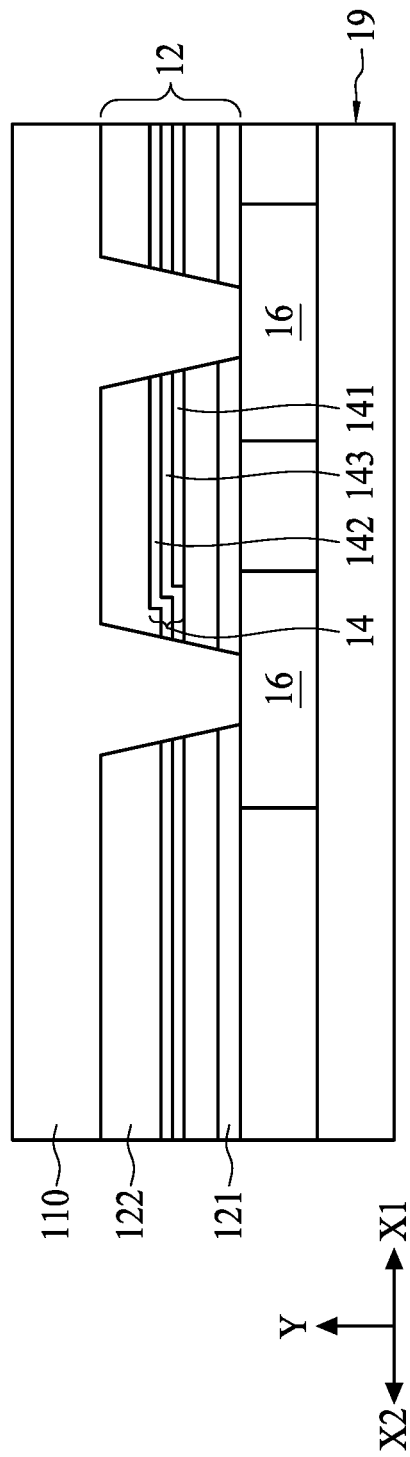
Figure 21:
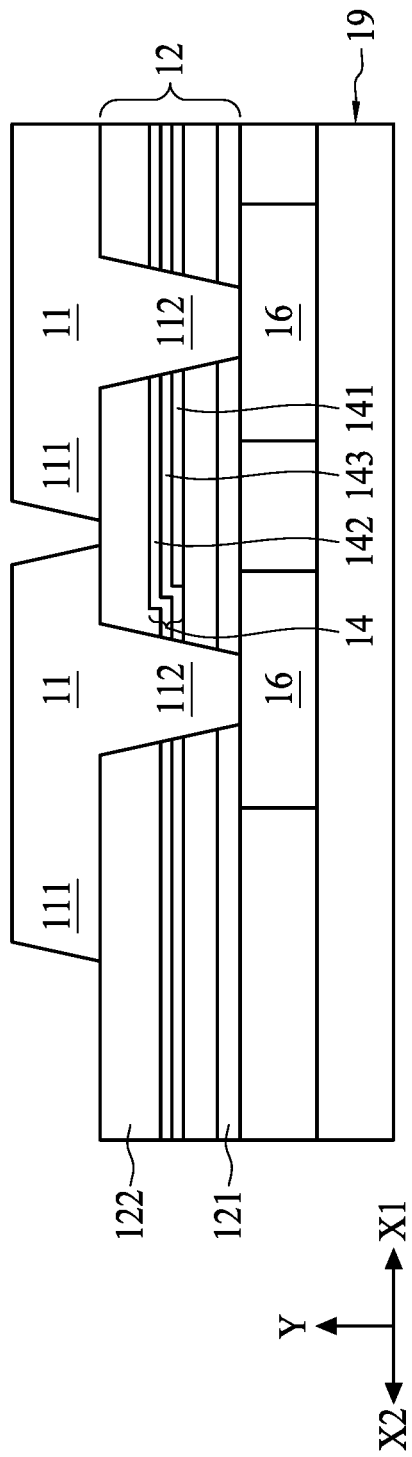

FIG. 16 illustrates the semiconductor package electrically connected to a PCB through the conductive bumps 23.

FIGS. 17 to 32 are cross-sectional views illustrating exemplary operations for providing a semiconductor package of the present disclosure. In some embodiments, the operations of FIGS. 17 to 32 may be used to provide or manufacture the semiconductor package illustrated in FIG. 3.

The steps shown in FIGS. 17 to 21 are respectively similar to the steps shown in FIGS. 5 to 9, and are not described again herein.

Figure 22:
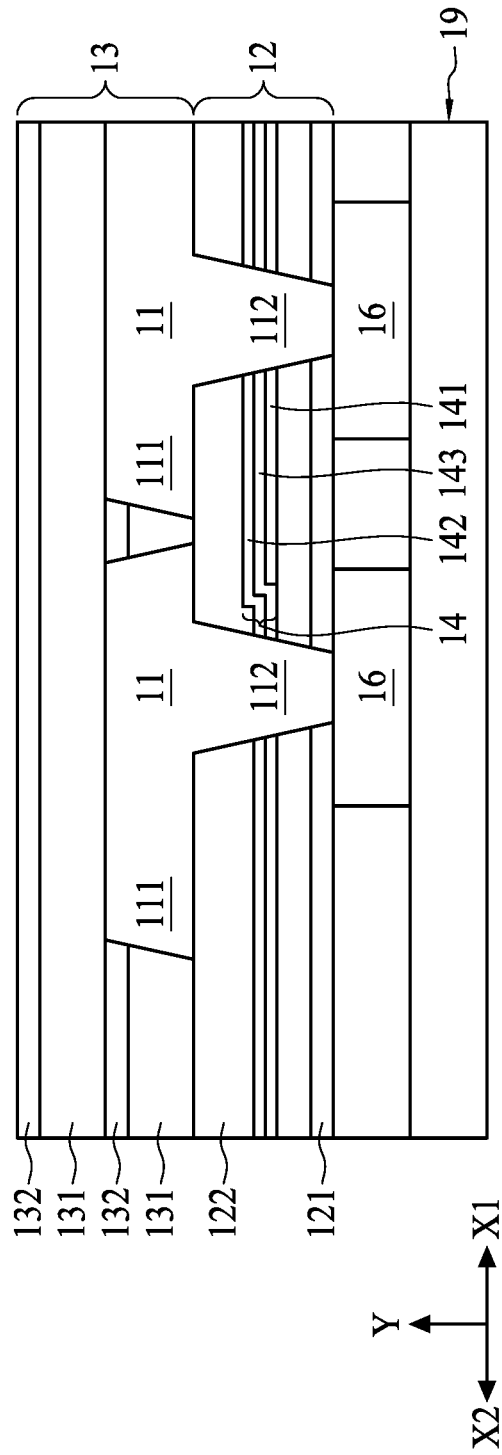

Referring to FIG. 22, the second passivation layer 13 is formed over the first conductive features 11. In some embodiments, one oxide-containing layer 131, one nitride-containing layer 132, another oxide-containing layer 131 and another nitride-containing layer 132 are formed along the third direction Y.

Figure 23:
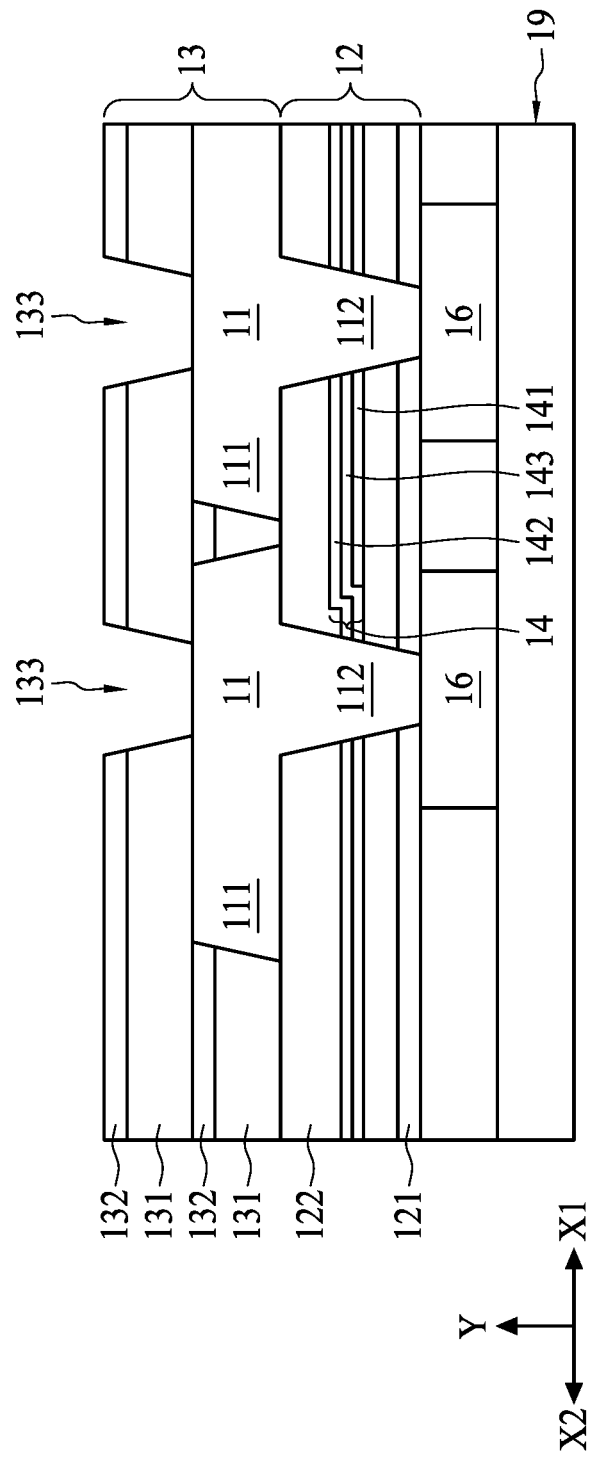

FIG. 23 illustrates the formation of the openings 133 in the second passivation layer 13 to expose the central portions of the first conductive features 11. The central portions of the first conductive features 11 may be exposed using a suitable photolithographic mask and etching process, although any suitable process may be used.

Figure 24:
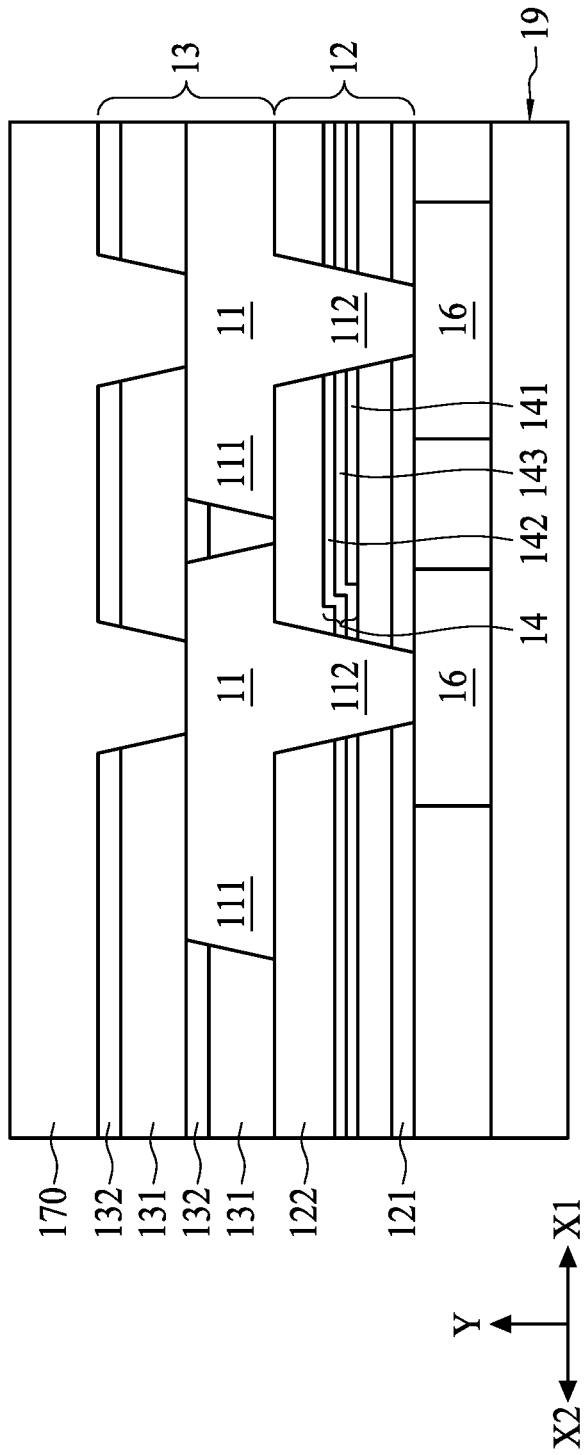

Referring to FIG. 24, the openings 123 are filled with conductive material and a second conductor 170 is formed on the second passivation layer 13. The conductive material forming the second conductor 170 may be same as or different from the conductive material forming the first conductor 110. The second conductor 170 may be formed using an electro-chemical plating process, an electroless plating process, PVD, ALD, the like, or a combination thereof.

Figure 25:
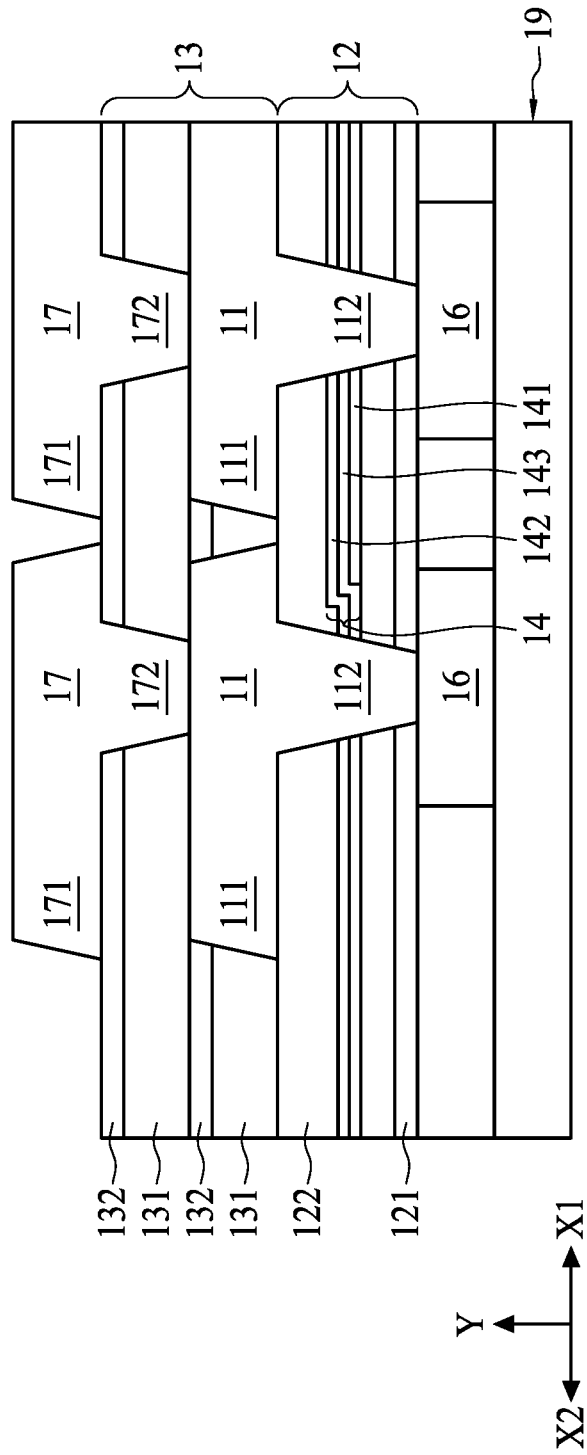

FIG. 25 illustrates the formation of the redistribution portions 171 of the second conductive features 17. A method of forming the redistribution portion 171 of the second conductive features 17 may be similar to or different from the method of forming the redistribution portions 111 of the first conductive features 11.

Figure 26:
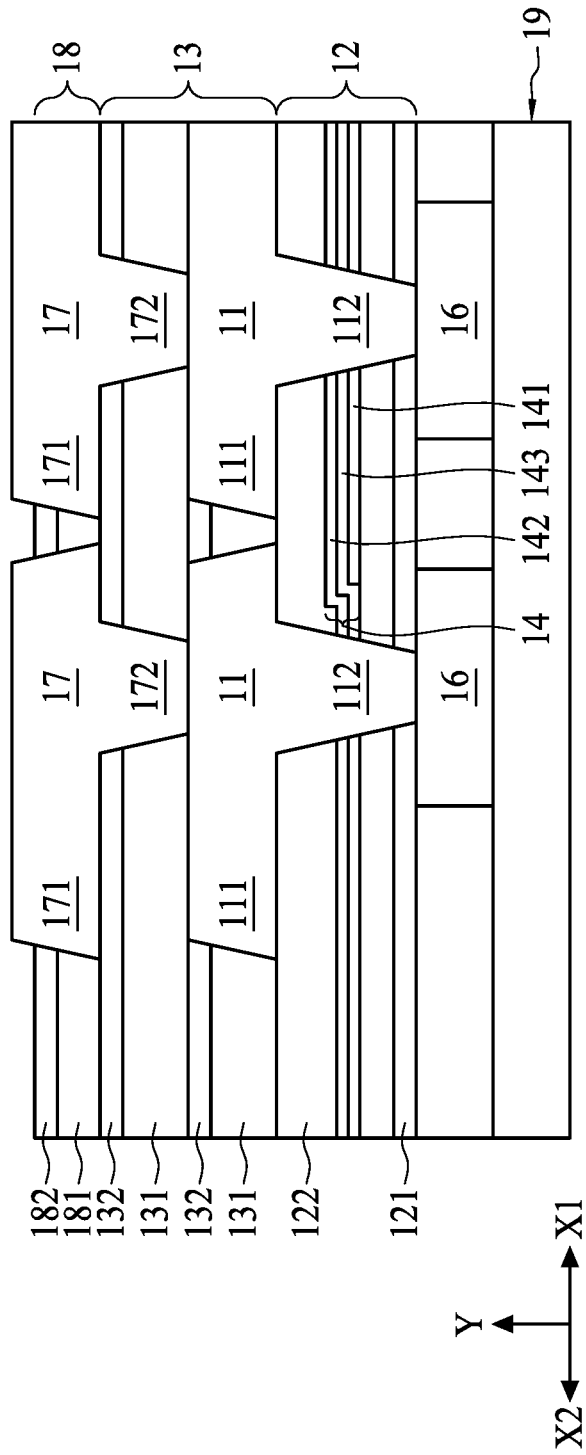

Referring to FIG. 26, the third passivation layer 18 is formed over the second conductive features 17. In some embodiments, an oxide-containing layer 181 is formed over the second conductive features 17, and a nitride-containing layer 182 is disposed on the oxide-containing layer 181.

Figure 27:
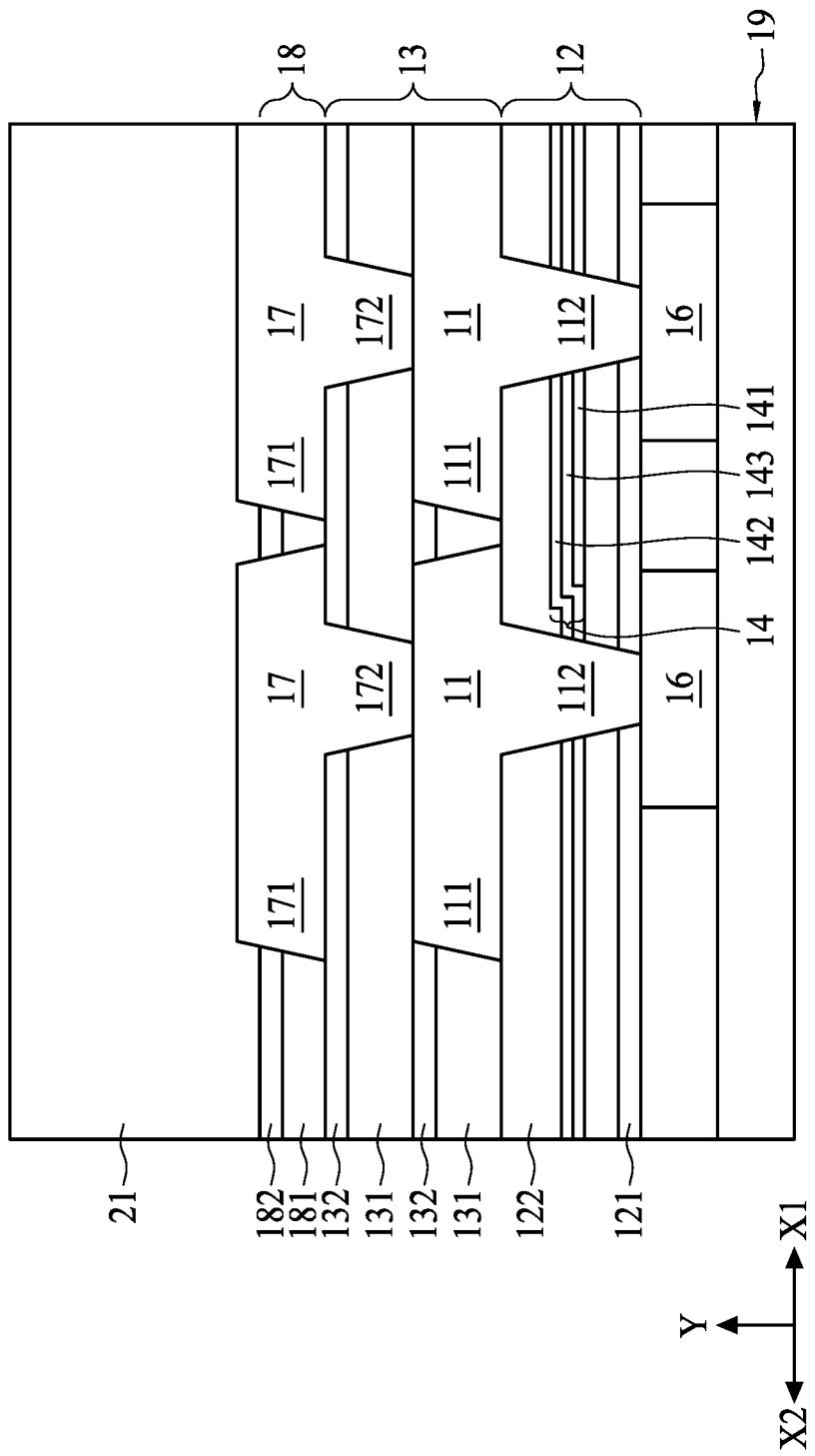

Referring to FIG. 27, the insulation layer 21 is thus formed on the third passivation layer 13 and the second conductive feature 17. The insulation layer 21 may be formed using an electro-chemical plating process, an electroless plating process, PVD, ALD, the like, or a combination thereof.

Figure 28:
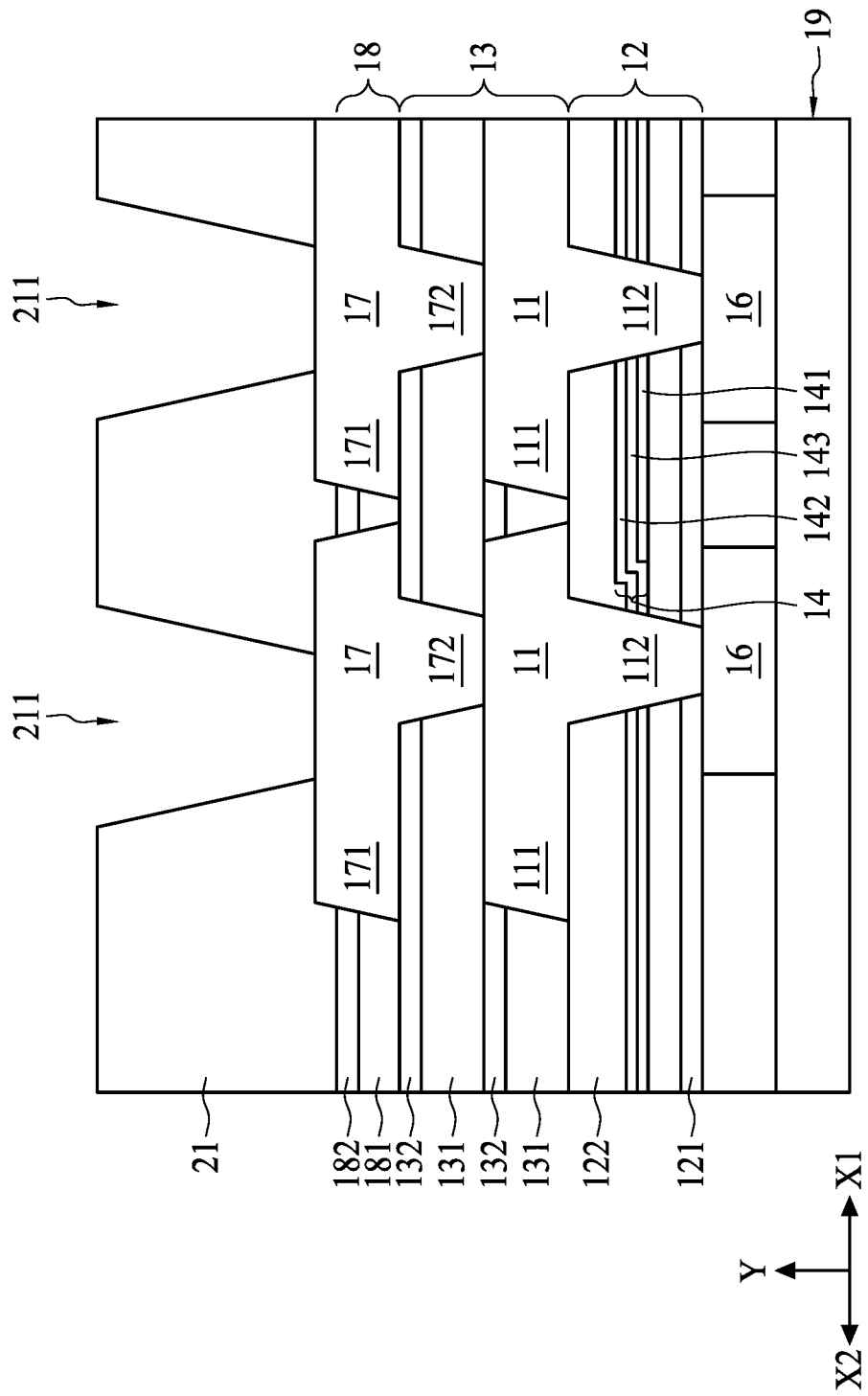
Figure 29:
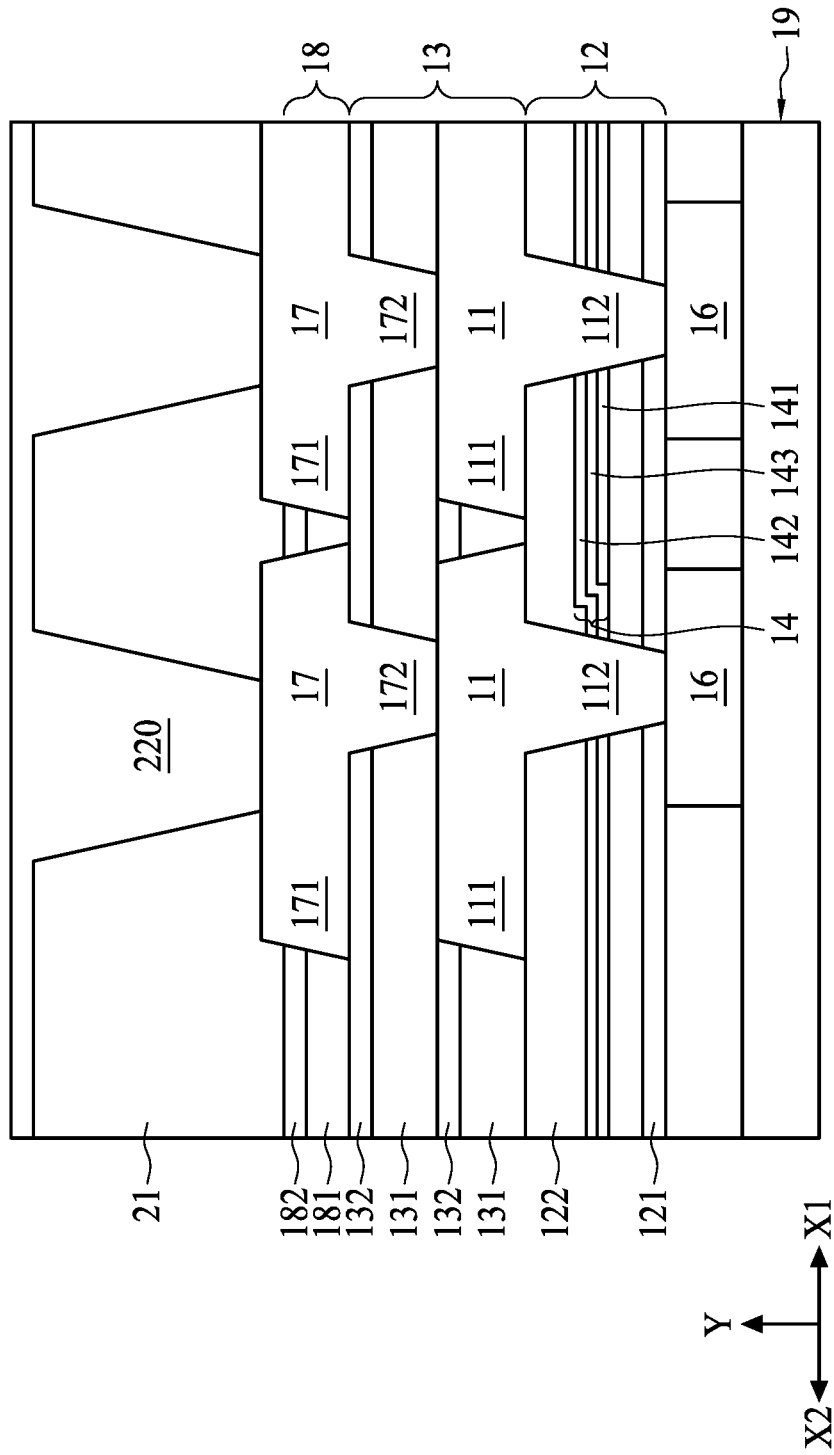
Figure 30:
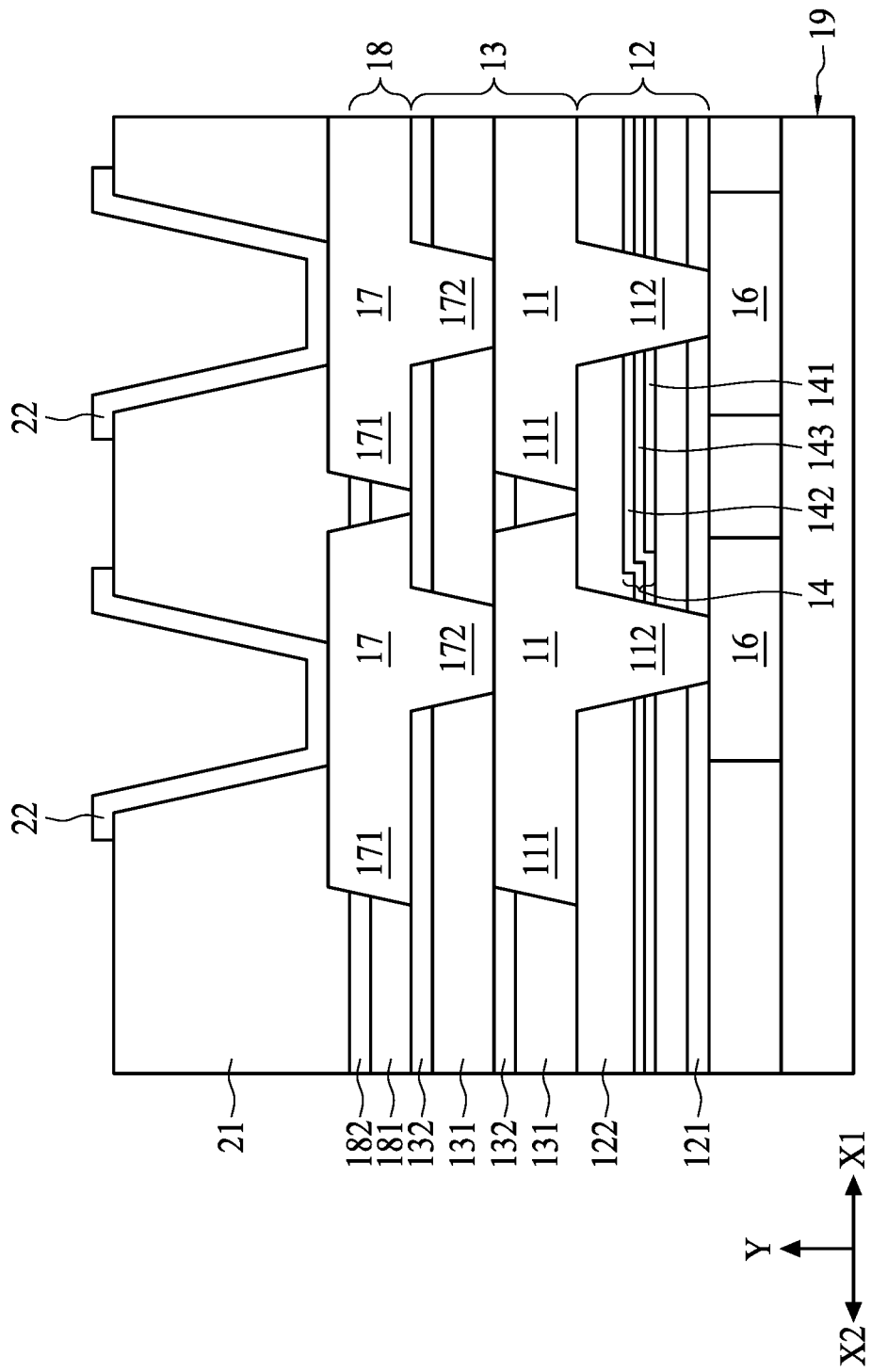
Figure 31:
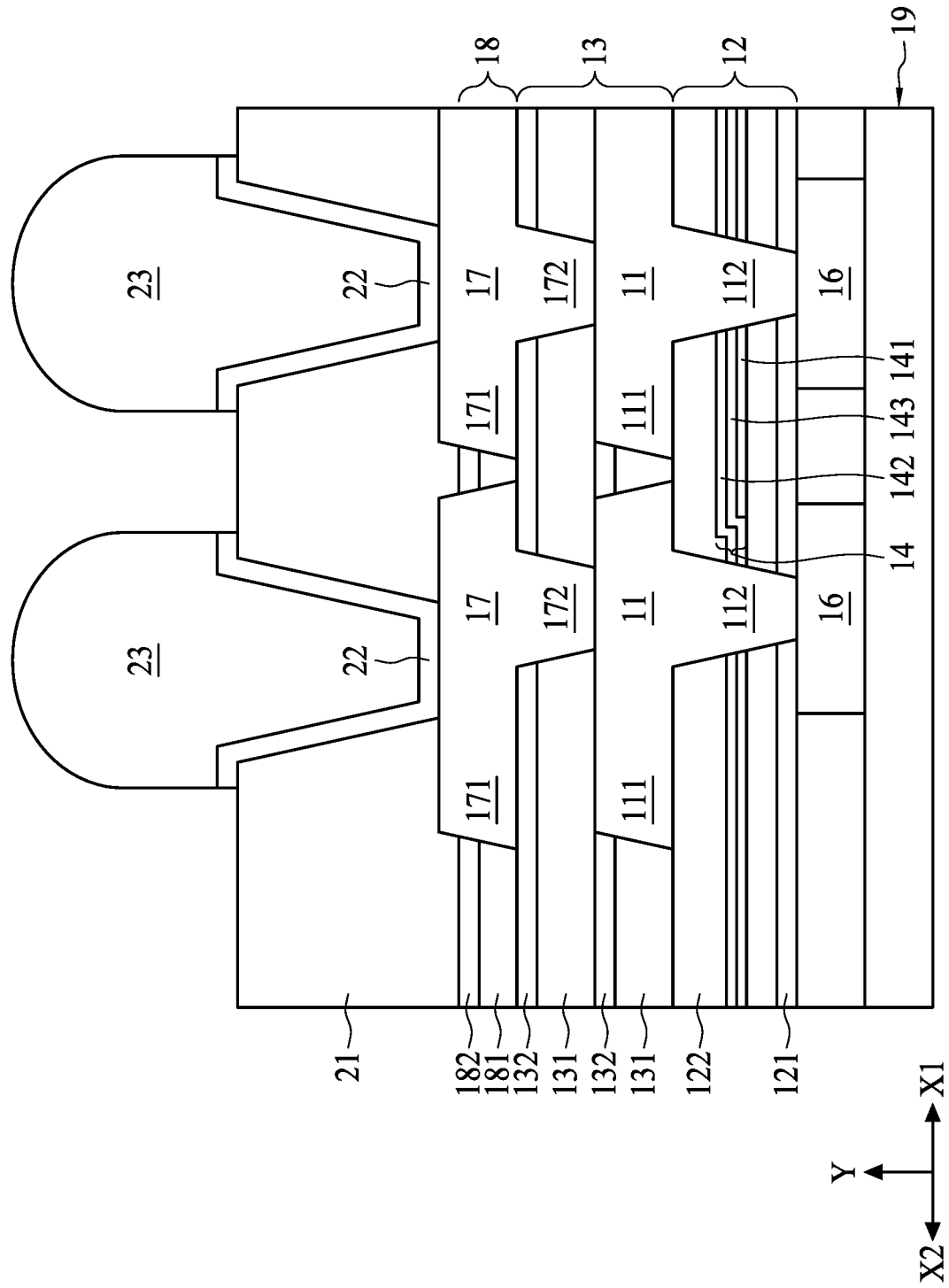
Figure 32:
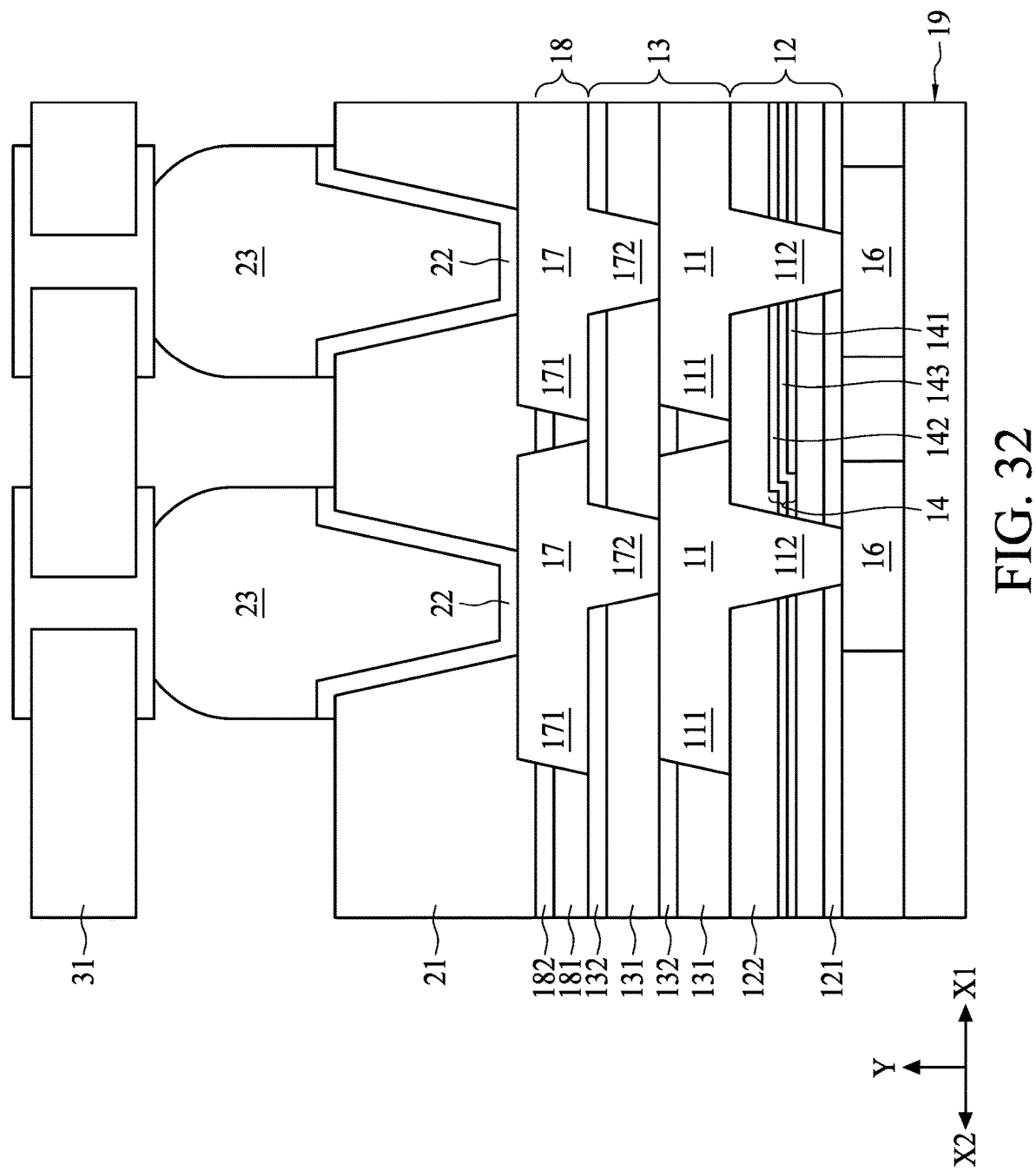

FIG. 28 illustrates the formation of the openings 211 in the insulation layer 21 to expose the central portions of the second conductive features 17. The central portions of the second conductive features 17 may be exposed using a suitable photolithographic mask and etching process, although any suitable process may be used.

The steps shown in FIGS. 29 to 32 are respectively similar to the steps shown in FIGS. 12 to 15, and are not described again herein.

Accordingly, the present disclosure therefore provides a semiconductor package and a method of manufacturing a semiconductor package. The semiconductor package includes a conductive feature, and a plurality of passivation layers. The conductive feature includes a redistribution portion and a via portion, and the maximum width of the redistribution portion is more than 10 times the maximum width of the via portion. Consequently, the semiconductor package can minimize, prevent, and/or stop the spreading of a crack due to the external forces or CTE mismatch.

Some embodiments of the present disclosure provide a semiconductor package including a first conductive feature configured as an input/output (I/O) terminal of the semiconductor package, a first passivation layer, a capacitor, and a second passivation layer. The first conductive feature includes a redistribution portion and a via portion. The maximum width of the redistribution portion along a first direction is times the maximum width of the via portion along the first direction. The first passivation layer is surrounding the via portion of the first conductive feature. The capacitor is substantially within the first passivation layer and electrically coupled to the first conductive feature. The second passivation layer is formed on the first passivation layer and surrounding the redistribution portion of the first conductive feature.

Some embodiments of the present disclosure provide a semiconductor package including at least two first conductive features respectively configured as an input/output (I/O) terminal of the semiconductor package, a first passivation layer, at least two second conductive features respectively configured as an input/output (I/O) terminal of the semiconductor package, a second passivation layer, and a third passivation layer. Each of the first conductive features includes a redistribution portion and a via portion, and the maximum width of the redistribution portions along a first direction is more than 10 times the maximum width of the via portion along the first direction. The first passivation layer surrounds the via portions of the first conductive features. Each of the second conductive features includes a redistribution portion and a via portion, and the via portion of each of the second conductive features is electrically connected to the redistribution portion of one of the first conductive features. The second passivation layer formed on the first passivation layer and surrounding the redistribution portions of the first conductive features and the via portions of the second conductive features, wherein the second passivation layer includes an oxide-containing layer extending along the first direction and a nitride-containing layer extending along the first direction. The third passivation layer formed on the second passivation layer and surrounding the redistribution portions of the second conductive features.

Some embodiments of the present disclosure provide a method for manufacturing a semiconductor package. The method includes providing a conductive trace formed on a surface of an inter-metal dielectric, forming a first passivation layer over the inter-metal dielectric and the conductive trace, forming an opening in the first passivation layer to expose the conductive trace, and filling the opening in the first passivation layer and forming a first conductive feature. The first conductive feature includes a redistribution portion disposed on the first passivation layer and a via portion embedded in the first passivation layer and electrically connected to the conductive trace. The maximum width of the redistribution portions along a first direction is more than 10 times the maximum width of the via portion along the first direction.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A semiconductor package, comprising:
    a first conductive feature configured as an input/output (I/O) terminal of the semiconductor package, wherein the first conductive feature includes a redistribution portion and a via portion, and the maximum width of the redistribution portion along a first direction is more than 10 times the maximum width of the via portion along the first direction;
    a first passivation layer surrounding the via portion of the first conductive feature;
    a capacitor substantially within the first passivation layer and electrically coupled to the first conductive feature, wherein the capacitor comprises a capacitor bottom metal electrode, a capacitor top metal electrode and a dielectric layer disposed between the capacitor bottom metal electrode and the capacitor top metal electrode, and the dielectric layer contacts the via portion of the first conductive feature; and
    a second passivation layer formed on the first passivation layer and surrounding the redistribution portion of the first conductive feature.

2. The semiconductor package of claim 1, wherein the semiconductor package includes at least two first conductive features, the capacitor bottom metal electrode extends along the first direction and is electrically connected to the via portion of one of the at least two first conductive features, and the capacitor top metal electrode extends along a second direction opposite to the first direction and is electrically connected to the via portion of the other one of the at least two first conductive features.

3. The semiconductor package of claim 2, wherein the dielectric layer of the capacitor extends along the first direction.

4. The semiconductor package of claim 1, wherein the first passivation layer has a thickness greater than 8000 Å along a third direction perpendicular to the first direction.

5. The semiconductor package of claim 1, wherein the first passivation layer includes a nitride-containing layer extending along the first direction and a planarizing layer extending along the first direction and disposed on the nitride-containing layer.

6. The semiconductor package of claim 1, wherein the second passivation layer has a thickness greater than 12000 Å along a third direction perpendicular to the first direction.

7. The semiconductor package of claim 1, wherein the second passivation layer includes an oxide-containing layer extending along the first direction and a nitride-containing layer extending along the first direction.

8. The semiconductor package of claim 7, wherein the nitride-containing layer of the second passivation layer is disposed on the oxide-containing layer of the second passivation layer.

9. The semiconductor package of claim 1, wherein the redistribution portion of the first conductive feature is electrically connected to a conductive bump, and the via portion of the first conductive feature is electrically connected to a conductive trace.

10. The semiconductor package of claim 1, further comprising an insulation layer formed on the second passivation layer.

11. A semiconductor package, comprising:
    at least two first conductive features respectively configured as an input/output (I/O) terminal of the semiconductor package, wherein each of the first conductive features includes a redistribution portion and a via portion, and the maximum width of the redistribution portions along a first direction is more than 10 times the maximum width of the via portion along the first direction;
    a first passivation layer surrounding the via portions of the first conductive features;
    at least two second conductive features respectively configured as an input/output (I/O) terminal of the semiconductor package, wherein each of the second conductive features includes a redistribution portion and a via portion, and the via portion of each of the second conductive features is electrically connected to the redistribution portion of one of the first conductive features;
    a second passivation layer formed on the first passivation layer and surrounding the redistribution portions of the first conductive features and the via portions of the second conductive features, wherein the second passivation layer includes an oxide-containing layer extending along the first direction and a nitride-containing layer disposed on the oxide-containing layer and extending along the first direction, and a thickness of the nitride-containing layer is less than a thickness of the oxide-containing layer; and a third passivation layer formed on the second passivation layer and surrounding the redistribution portions of the second conductive features.

12. The semiconductor package of claim 11, wherein a ratio of the thickness of the oxide-containing layer to the thickness of the nitride-containing layer of the second passivation layer along a third direction perpendicular to the first direction is between 15:7 and 1:3.

13. The semiconductor package of claim 11, wherein the second passivation layer has a thickness greater than 12000 Å along a third direction perpendicular to the first direction.

14. The semiconductor package of claim 11, wherein the third passivation layer includes an oxide-containing layer extending along the first direction and a nitride-containing layer extending along the first direction.

15. The semiconductor package of claim 11, further comprising a capacitor substantially within the first passivation layer and electrically coupled to the first conductive feature.

16. The semiconductor package of claim 11, wherein each of the redistribution portions of the at least two second conductive feature is respectively electrically connected to a conductive bump.

17. The semiconductor package of claim 11, wherein each of the via portions of the first conductive features is electrically connected to a conductive trace.

18. A method of manufacturing a semiconductor package, comprising:

providing a conductive trace formed on a surface of an inter-metal dielectric;

forming a first passivation layer including a capacitor over the inter-metal dielectric and the conductive trace, wherein the capacitor comprises a capacitor bottom metal electrode, a capacitor top metal electrode and a dielectric layer disposed between the capacitor bottom metal electrode and the capacitor top metal electrode;

forming an opening in the first passivation layer to expose the conductive trace;

forming a conductor covering the first passivation layer and filling the opening in the first passivation; and removing a portion of the conductor to form a first conductive feature, wherein the first conductive feature includes a redistribution portion disposed on the first passivation layer and a via portion embedded in the first passivation layer and electrically connected to the conductive trace, wherein the via portion contacts the dielectric layer of the capacitor in the first passivation layer, and the maximum width of the redistribution portions along a first direction is more than 10 times the maximum width of the via portion along the first direction.

19. The method of claim 18, further comprising:

forming a second passivation layer over the first conductive feature.

20. The method of claim 19, further comprising:

forming an opening in the second passivation layer to expose the redistribution portion of the first conductive feature; and filling the opening in the second passivation layer and forming a second conductive feature, wherein the second conductive feature includes a redistribution portion disposed on the second passivation layer and a via portion embedded in the second passivation layer and electrically connected to the first conductive feature, wherein the maximum width of the redistribution portion of the second conductive feature along a first direction is more than 10 times the maximum width of the via portion of the second conductive feature along the first direction.

* * * * *